US008776841B2

(12) United States Patent
Kishkovich et al.

(10) Patent No.: US 8,776,841 B2
(45) Date of Patent: Jul. 15, 2014

(54) SYSTEM FOR PURGING RETICLE STORAGE

(75) Inventors: Oleg P. Kishkovich, Greenville, RI (US); Xavier Gabarre, Caluire Et Cuire (FR); William M. Goodwin, Medway, MA (US); James Lo, Taipei (TW); Troy Scoggins, Decatur, TX (US)

(73) Assignee: Entegris, Inc., Billerica, MA (US)

( * ) Notice: Subject to any disclaimer, the term of this patent is extended or adjusted under 35 U.S.C. 154(b) by 1549 days.

(21) Appl. No.: 12/305,895

(22) PCT Filed: Jun. 19, 2007

(86) PCT No.: PCT/US2007/014428
§ 371 (c)(1),
(2), (4) Date: Jul. 21, 2010

(87) PCT Pub. No.: WO2007/149513
PCT Pub. Date: Dec. 27, 2007

(65) Prior Publication Data
US 2010/0294397 A1    Nov. 25, 2010

Related U.S. Application Data

(60) Provisional application No. 60/814,824, filed on Jun. 19, 2006, provisional application No. 60/844,570, filed on Sep. 14, 2006, provisional application No. 60/903,488, filed on Feb. 26, 2007.

(51) Int. Cl.
*H01L 21/67* (2006.01)
*H01L 21/677* (2006.01)

(52) U.S. Cl.
CPC ....... *H01L 21/67769* (2013.01); *Y10S 414/135* (2013.01); *Y10S 414/137* (2013.01); *Y10S 414/139* (2013.01); *Y10S 414/14* (2013.01)
USPC ................. 141/85; 141/63; 141/98; 141/66; 206/711; 414/935; 414/937; 414/939; 414/940

(58) Field of Classification Search
CPC ................................................ H01L 21/67769
USPC ......... 141/1, 4, 51, 63, 65, 66, 85, 89, 94, 98, 141/110, 346, 356; 206/710; 414/808, 810, 414/935–941; 134/10, 11, 31, 61, 76, 77, 134/84
See application file for complete search history.

(56) References Cited

U.S. PATENT DOCUMENTS 4,986,715 A * 1/1991 Asakawa .................. 414/331.05
5,031,674 A * 7/1991 Mack .............................. 141/66
(Continued)

FOREIGN PATENT DOCUMENTS

EP    0 617 573 A1    9/1994
JP    06-156622    6/1994
(Continued)

*Primary Examiner* — Timothy L Maust
*Assistant Examiner* — Robert Bell, III
(74) *Attorney, Agent, or Firm* — Christensen Fonder P.A.

(57) ABSTRACT

The present invention provides a method, system, and components for protecting reticles and specifically for minimizing haze formation on reticles during storage and use. By substantially continually maintaining a purge in a storage housing having a reduced humidity level on reticles or by temporarily storing the reticle in a container in proximity to a desiccant or getter when not being purged, haze formation can be eliminated, minimized, or sufficiently controlled. Moreover, a filter media in the container may be positioned to be "recharged" during the substantially continual purging of the reticle, a reduced desirable humidity level can be readily maintained in the reticle container when the container is not currently being purged. Additionally, the system of the invention can comprise an ionizer associated with the purge system. For example, the ionizer can be associated with at least one of the plurality of purge lines of the purge system. The system of the invention can also include a purge gas source connected to the purge system that comprises a source of CDA or extra CDA. The storage housing can comprise a plurality of shelves that each include a plurality of reticle storage receptacles.

21 Claims, 27 Drawing Sheets

(56) References Cited

U.S. PATENT DOCUMENTS

| | | | |
|---|---|---|---|
| 5,303,482 A * | 4/1994 | Yamashita et al. | 34/80 |
| 5,346,518 A * | 9/1994 | Baseman et al. | 96/126 |
| 5,363,867 A | 11/1994 | Kawano et al. | |
| 5,746,008 A * | 5/1998 | Yamashita et al. | 34/211 |
| 5,806,574 A * | 9/1998 | Yamashita et al. | 141/63 |
| 5,879,458 A | 3/1999 | Roberson, Jr. et al. | |
| 5,997,398 A | 12/1999 | Yamada et al. | |
| 6,056,026 A | 5/2000 | Fosnight et al. | |
| 6,302,927 B1 * | 10/2001 | Tanigawa | 29/25.01 |
| 6,322,633 B1 * | 11/2001 | Bexten et al. | 134/1 |
| 6,368,411 B2 * | 4/2002 | Roberson et al. | 118/715 |
| 6,418,979 B1 * | 7/2002 | Lewis et al. | 141/4 |
| 6,439,822 B1 * | 8/2002 | Kimura et al. | 414/331.04 |
| 6,565,669 B1 * | 5/2003 | Bohon, III | 134/21 |
| 6,585,470 B2 * | 7/2003 | Van Der Meulen | 414/217 |
| 6,682,414 B2 * | 1/2004 | Nakao | 454/187 |
| 6,690,993 B2 * | 2/2004 | Foulke et al. | 700/218 |
| 6,758,876 B2 * | 7/2004 | Suzuki et al. | 55/385.6 |
| 6,906,783 B2 * | 6/2005 | del Puerto et al. | 355/53 |
| 7,077,173 B2 * | 7/2006 | Tokunaga | 141/66 |
| 7,209,220 B2 * | 4/2007 | Puerto et al. | 355/75 |
| 7,234,908 B2 * | 6/2007 | Nulman et al. | 414/222.01 |
| 7,258,520 B2 * | 8/2007 | Elliott et al. | 414/217 |
| 7,384,484 B2 * | 6/2008 | Muraoka et al. | 118/503 |
| 7,400,383 B2 * | 7/2008 | Halbmaier et al. | 355/72 |
| 8,146,623 B2 * | 4/2012 | Tieben et al. | 141/63 |
| 2005/0274430 A1 * | 12/2005 | Yokoi et al. | 141/65 |
| 2006/0016462 A1 * | 1/2006 | Asano | 134/18 |
| 2007/0144118 A1 * | 6/2007 | Alvarez et al. | 55/385.1 |

FOREIGN PATENT DOCUMENTS

| | | |
|---|---|---|
| JP | 2001-500669 | 1/2001 |
| WO | WO 98/11598 | 3/1998 |
| WO | WO 2006/108032 A2 | 10/2006 |

* cited by examiner

SYSTEM FOR PURGING RETICLE STORAGE

RELATED APPLICATIONS

This application claims priority to the following U.S. provisional applications: U.S. Application No. 60/814,824 filed Jun. 19, 2006; U.S. Application No. 60/844,570, filed Sep. 14, 2006; and U.S. Application No. 60/903,488, filed Feb. 26, 2007. All of the aforementioned Applications are hereby incorporated by reference herein in their entirety.

BACKGROUND OF THE INVENTION

Particulate and airborne molecular contaminants (AMC) pose considerable problems in semiconductor manufacturing facilities. These contaminants can cause reticle defects such as hazing. In general, reticle pods are used to protect reticles from these contaminants during storage and transport. Nonetheless, accumulation of these contaminants is common in reticle pods, which can degrade overall reticle quality. With such accumulation, there exists the opportunity for contaminants to enter the reticle pod when removing a reticle therefrom to use with a semiconductor tool. A typical approach for minimizing contaminants within a reticle pod involves periodic cleanings. One shortcoming with periodic cleanings is the potential for decreased manufacturing efficiencies.

Purging of wafers and reticles with nitrogen is known. Purging with nitrogen can eliminate contaminants in the reticle containment but presents problems in that nitrogen needs to be contained and controlled. Although nitrogen is not considered toxic, a nitrogen enriched environment with reduced oxygen, asphyxiation can result. Thus, leakages of nitrogen into space with personnel is not acceptable. Nitrogen enrichment can be detected only with sophisticated sensing equipment. Pure clean nitrogen is not inexpensive. Hazing can still occur with traditional nitrogen purging.

Thus, there remains a significant need for economically and safely protecting reticles during storage and transportation from contaminants and from hazing.

SUMMARY OF THE INVENTION

The present invention provides a method, system, and components for protecting reticles and specifically for minimizing haze formation on reticles during storage and use. By substantially continually maintaining either a purge of preferably extra dry clean air having a reduced humidity level on reticles or by temporarily storing the reticle in a container in proximity to an adsorbent or dessicant media when not being purged, haze formation can be eliminated, minimized, or sufficiently controlled. Moreover, a filter media in the container may be positioned to be "recharged" during the substantially continual purging of the reticle, a reduced desirable humidity level can be readily maintained in the reticle container when the container is not currently being purged.

The invention includes reticle storage comprising a storage housing having a plurality of reticles being stored or plurality of reticle storage receptacles, the receptacles configured for receiving reticle pods, for example reticle SMIF pods. The storage housing can comprise an inspection area or plurality of shelves that each include a plurality of reticle storage receptacles for reticle pods. The storage housing can be a reticle stocker, library or tool for transferring reticles from a reticle transport container, for example, a reticle SMIF pod, to a tool library for use. The storage housing can also be or include a cleanroom, inspection area or combination thereof. In one embodiment, the purge system includes a plurality of purge lines with each purge line being connected to one of the reticle storage receptacles. A preferred embodiment of the invention can use a diffuser at the inlet of each reticle receptacle or reticle container for example, a reticle SMIF pod, which causes a more even distribution of gas entering each pod from the associated purge line. The diffuser can be mounted at the inlet or injector port of the receptacle or container or at the outlet of the purge line, where gas flows into the pod. The discharge from the reticle pods is preferably through a filter open to the environment in the storage housing.

The system of the invention can also include a purge gas source connected to the purge system that comprises a source of clean dry air (CDA), extra CDA or dry inert gases such as nitrogen. A preferred embodiment of the invention uses extra CDA.

In one embodiment, each storage receptacle for a system of the invention can be configured to receive a reticle pod, for example, container or carrier. The reticle pod comprises an inlet that connects at least one of the purge lines of the purge system. Exemplary reticle pods for a system of the invention can be based on standard mechanical interface (SMIF) carriers such as generally described in a U.S. Application claiming priority to U.S. Application No. 60/668,189, filed Apr. 4, 2005 and entitled "ENVIRONMENTAL CONTROL IN A RETICLE SMIF POD," the contents of which, including U.S. Application No. 60/668,189, are hereby incorporated by reference herein. Moreover, a reticle pod can include a conventional reticle comprising a quartz material. Preferably, a reticle pod for a system of the invention comprises a filter member. For example, the filter member can comprise particulate or absorptive media and combinations thereof for protecting the reticle from contaminants during storage and transport.

The purge gas source for a system of the invention can also comprise a gas maintaining a concentration of less than about 10 parts per billion (ppb) of water in each reticle pod or other reticle storage system. By providing a storage environment substantially free of water, the risk of water being introduced into the tool with a reticle can be substantially reduced or eliminated. Moreover, an environment substantially free of water can reduce the likelihood of contaminants or particulates disposing or forming on the reticle, particularly, quartz materials thereof. Consequently, the rate of haze formation in the optical system of a tool or on at least one reticle surface can be reduced. Haze can often be formed from ammonium sulfate, which can occur in the presence of sulfuric acid, ammonia and water. Thus, by removing water from the reticle environment, a substantial reduction or elimination of the formation of ammonium sulfate on the reticle surface results.

The system of the invention can also comprise a semiconductor tool reticle storage bay. For example, the reticle storage bay can be associated with a conventional semiconductor tool such as a photolithography tool. In one embodiment, the reticle storage bay can be connected to a bay purge line. The invention also provides a method for purging reticle storage, which can be continuous. Preferably, the method includes providing a gas comprising CDA or, preferably, extra CDA, through at least one purge line to the reticle storage receptacle of the storage housing for a system of the invention. The invention also comprises systems and methods for purging reticle stockers, libraries, tools, cleanrooms and inspection areas. Furthermore, a method of the invention can comprise introducing a gas to a reticle pod received by a reticle storage receptacle. A method can also comprise contacting a reticle disposed in the reticle pod with the gas comprising CDA or extra CDA.

Additionally, the system of the invention can comprise an ionizer associated with the purge system. For example, the ionizer can be associated with at least one of the plurality of purge lines of the purge system.

DESCRIPTION OF THE DRAWINGS

Other features and advantages of the invention may also be apparent from the following detailed description thereof, taken in conjunction with the accompanying drawings of which:

FIG. 1b is a perspective view of the reticle pod of FIG. 1a;

FIG. 7a is a plan view of exemplary reticle pods received by reticle storage receptacles associated with shelves of the type in FIG. 6a;

DETAILED DESCRIPTION OF THE INVENTION

The present invention provides a system for purging reticle storage comprising a storage housing having a plurality of reticle storage receptacles. The storage housing can comprise a plurality of shelves that each include a plurality of reticle storage receptacles. Preferably, the system also comprises a purge system associated with the storage housing. In one embodiment, the purge system includes a plurality of purge lines with each purge line being connected to one of the storage receptacles. Additionally, the system of the invention can comprise an ionizer associated with the purge system. For example, the ionizer can be associated with at least one of the plurality of purge lines of the purge system. The system of the invention can also include a purge gas source connected to the purge system that comprises a source of CDA or extra CDA. CDA is defined as air having a water concentration of less than 2 ppm (part per million). Extra CDA is defined herein as a gas having a water concentration of less than 1 ppb (part per billion).

Figure 1A:
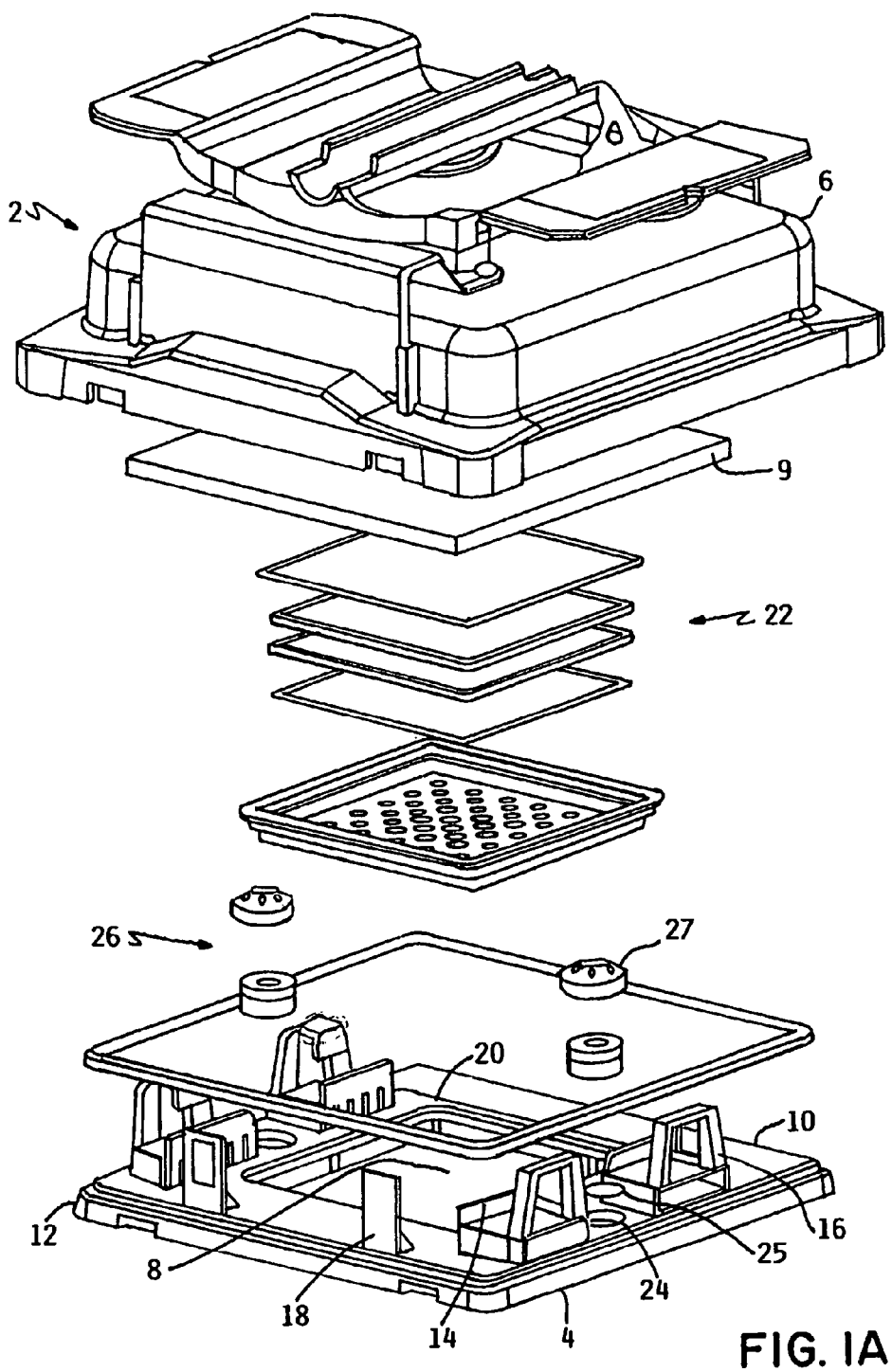
FIG. 1a is an exploded view of an exemplary reticle pod for a system of the invention.
Figure 1B:
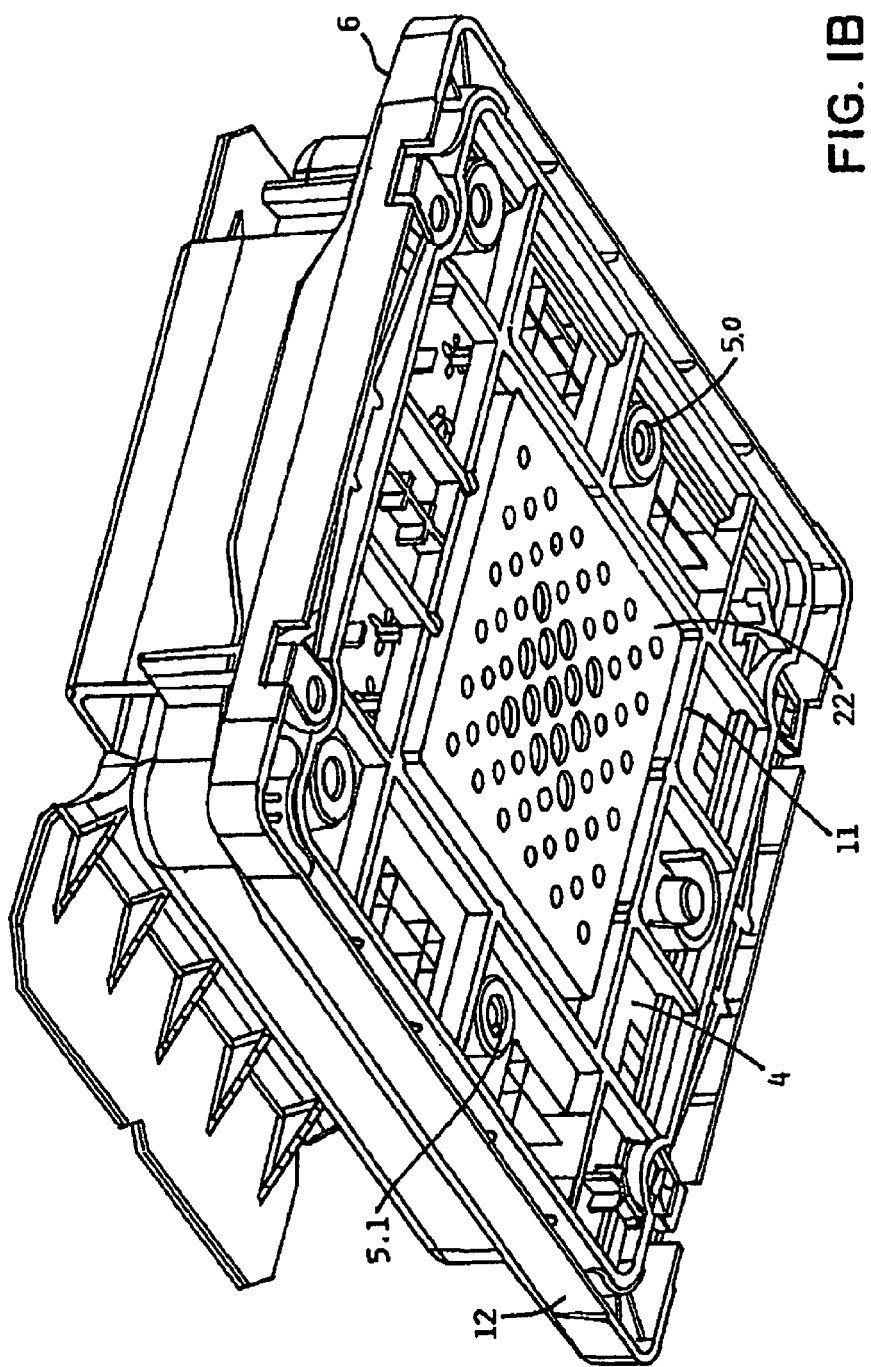

FIGS. 1a and 1b are a representation of an exemplary reticle pod for a system of the invention. As shown, a reticle pod 2 can be equipped with a chemical filtration system or getter. The reticle pod generally comprises a door or base portion 4, which mates with a carrier shell or cover 6 to form a hermetically sealed space 8 to provide a controlled environment. Within the sealed environment, a reticle 9 can be stored and transferred. For example, the reticle 9 can comprise quartz blanks, photomasks or substrates that are susceptible to damage from particulates and gas-phase chemical contaminants. Such a reticle pod is disclosed in more detail in U.S. Publication No. 2006/0266011 of U.S. application Ser. No. 11/396,949 which is incorporated herein by reference.

Preferably, the door portion 4 of FIGS. 1a and 1b can include an opposed upper door surface 10 and lower door surface 11, separated by a lateral wall 12. In FIGS. 1a and 1b, a plurality of reticle supports 14, reticle side positioning members 16 and back positioning members 18 extend outwardly from and are disposed in a spaced apart relationship adjacent an upper periphery of and generally about a central portion 20 of the upper door surface over the filter 22. The reticle supports can be configured to hold the reticle at a predefined height above the upper door surface. The reticle side positioning members and back positioning members can serve to guide manual positioning of the reticle, ensuring proper lateral and rearward placement of the reticle on its supports.

In one embodiment, the filter 22 of FIG. 1 can have a variety of constructions each of which provides for a fluid-permeable, high efficiency, low-pressure drop, adsorptive composite filter such as generally described by U.S. Pat. Nos. 7,014,693, 6,761,753, 6,610,128, and 6,447,584, the contents of which are hereby incorporated by reference herein. For example, adsorptive media for the filter can include, without limitation, chemisorptive or physisorptive media and combinations thereof. Other media for the filter can comprise, for example, high efficiency particulate air (HEPA) or ultra low penetration air (ULPA) filter mediums, which can also be used in combination or along with adsorptive media. Preferably, the reticle pod for a system of the invention can comprise a passive purifier or desiccant member. Exemplary passive purifiers or desiccant members can reduce the extent of contaminants that may contact the reticle.

The concentration of moisture within the hermetically sealed space 8 of the reticle pod 2 in FIG. 1 is preferably maintained at concentration levels approaching a few ppb. The system of a preferred embodiment of the invention also provides for maintaining or controlling the level of humidity within the reticle pod to a concentration of less than about 10 ppb of water. In one embodiment, the reticle pod of FIG. 1 can be associated with the system of the invention to achieve such humidity levels. The system of a preferred embodiment of the invention provides a periodic or continuous purge comprising CDA or, more preferably, extra CDA. The invention contemplates that the purge gas can be inert such as, for example, dry argon or nitrogen. The system of the invention can also be associated with the reticle pod 2 by injector or inlet ports 24, which can connect to at least one purge line. The inlet port 24 can be fitted with a diffuser element 25, which causes the purge gas to flow more uniformly within each pod. Preferably, the diffuser element is a porous material with a pore size of 1-3 microns (μm). The diffuser element can be a metal such as nickel or stainless steel, made by sintering a powder of the metal. The pores can allow passage of particles less than 3 nanometers (nm) in diameter and prevent passage of larger particles. The diffuser can also be located at the outlet of each purge line as the purge gas flows into the pod or used at the purge of any reticle storage housing, reticle library, inspection tool or tools for transferring reticles from transport pods into libraries or those for storage or use.

The filter 22 can also comprise an extractor part as explained in more detail below. In such a case, both ports 5.0 and 5.1 constitute inlet ports.

In one embodiment, the upper periphery of the door portion 4 in FIGS. 1a and 1b can be configured with inlet 5.0 and extractor ports 5.1 extending therethrough between upper and lower surfaces thereof in a direction generally parallel with its lateral wall 12. The inlet and extractor ports can also be configured to coaxially receive an inlet fitting 26 and extractor fitting 27. The invention also contemplates other connection means for these fittings and ports. For example, the inlet fitting can be detachably coupled to the purge line of a system of the invention. Moreover, the extractor fitting can also be detachably coupled to a purge removing line, which may be associated with a purge evacuation system. The inlet and extractor fittings can also be equipped with check valves, configured to allow a unidirectional flow. When the system of the invention is not purging the reticle pod, check valves prevent ingress or egress of contaminants into the hermetically sealed space 8.

Furthermore, diaphragm valves with slits such as those generally described by U.S. Pat. No. 5,482,161, the contents of which are hereby incorporated by reference herein, can also be employed in conjunction with or without the check valves for the inlet and extractor fittings. Diaphragm and check valves can also limit the exposure of the filter 22 and its media to ambient conditions external to the reticle pod 2. The invention also contemplates that using a system of the invention to inject a purge gas comprising CDA, extra CDA, nitrogen or other inert gases under pressure into the hermetically sealed space 8 may cause at least a portion of the purge gas to egress through the filter and exit the reticle pod. In one embodiment, the extractor fitting can also be replaced by an inlet fitting coupled to the gas inlet. As such, the hermetically sealed space can be pressurized by the purge gas flowing into the reticle pod through such inlet fittings. The purge gas then exits the hermetically sealed space through the filter 22.

Generally, purging the hermetically sealed space 8 in FIG. 1 removes trace contaminants by entraining them in the gas flow. In one embodiment, purging via the system of the invention can dislodge and remove particulates and other contaminants such as those associated with any physisorptive media of the filter. Purging with CDA or extra CDA also can maintain and control the humidity levels within the reticle pod 2. For example, the system of the invention can dehumidify the filter 22. Moreover, a purge line for a system of the invention can be associated with the reticle pod to purge contaminants and maintain a concentration of less than about 10 ppb of water therein. For example, the purge line can be connected to one or more storage receptacles for the reticle pod. The purge line can also be part of a purge system for a system of the invention.

In one embodiment, the purge line can also be associated with a conventional ionizer. For example, a purge gas from a source comprising CDA or extra CDA enter the purge line and pass through an ionizer associated therewith. The purge gas then exits from the purge line and can be introduced into a storage receptacle for a reticle pod. Alternatively, the ionizer can be associated with the purge system for a system of the invention. The purge gas flow rate through such ionizers can be about 1.5 cubic feet per minute (CFM), although the invention contemplates other suitable flow rates that may be adjusted depending on parameters such as humidity levels in the reticle pod.

Manifold pressure of an ionizer for a system of the invention can be from about 0 to 70 pounds per square inch (PSI). In one embodiment, the ionizer can include ultraclean TEFLON (E. I. du Pont de Nemours and Company, 1007 Market Street, Wilmington, Del. 19898) tubing associated with one or more purge lines as an in-line device. Exemplary tubing can be from about 6 to 10 millimeters (mm) in diameter. An ionizer for a system of the invention can also be associated with a plurality of purge lines. Preferably, an ionizer can employ steady-state direct current ion emission. The invention also contemplates use of an in-line ionizer distributed by Ion Systems of Berkeley, Calif.

In one embodiment, a reticle pod for a system of the invention can comprise a pod base portion and pod shell portion that cooperate to form a controlled environment. The pod based portion can comprise a first surface that is configured to lie interiorly of the controlled environment. Moreover, a second surface can be configured to lie exteriorly of the controlled environment. The reticle pod can also comprise a central hole surrounded by and defining a gas flow path between the first and second surfaces. Preferably, the reticle pod can comprise a plurality of reticle supports and guides mounted on the first surface to support a reticle thereon. For example, the reticle supports and guides can define a reticle receiving region having a receiving surface being substantially coextensive with a patterned surface of the reticle.

Furthermore, the reticle pod can include a filter frame having an open and perforated bottom end. A lateral wall can connect the open end to the perforated bottom end to define a longitudinal gas flow passage therebetween. The filter frame can be closely received within a central hole in gas-tight engagement with the reticle pod. In one embodiment, the open end can be proximate to a first surface. The perforated bottom end can also be recessed from the first surface. Preferably, the reticle pod comprises a filter having an extent defining a filter shape and filter area. The filter can be layered and disposed within the gas flow passage in sealed engagement with the open end such that substantially all the gas entering or leaving the filter passes through the filter area.

A filter for, without limitation, a reticle pod, stocker, library, tool, cleanroom or inspection area of a system of the invention can comprise an ion exchange resin. For example, a filter comprising at least one ion exchange resin can be included in the systems of the invention to protect a reticle during storage and transport. Alternatively, a filter for a system of the invention may not comprise an ion exchange resin. Such ion exchange resins can feature porosities of higher than about 300 milliliters per gram. Preferably, an exchange resin of the filter can be a cation exchange resin having a concentration of chemically acidic sites of about 1.8 milliequivalent per gram. For example, an exchange resin for a filter or layers thereof can include a surface area of about 45 squared meters per gram. Exemplary resins for a filter are commercially available under the tradename AMBERLYST (Rohm and Hass Company, 100 Independence Mall West, Philadelphia, Pa. 19106).

Figure 2:
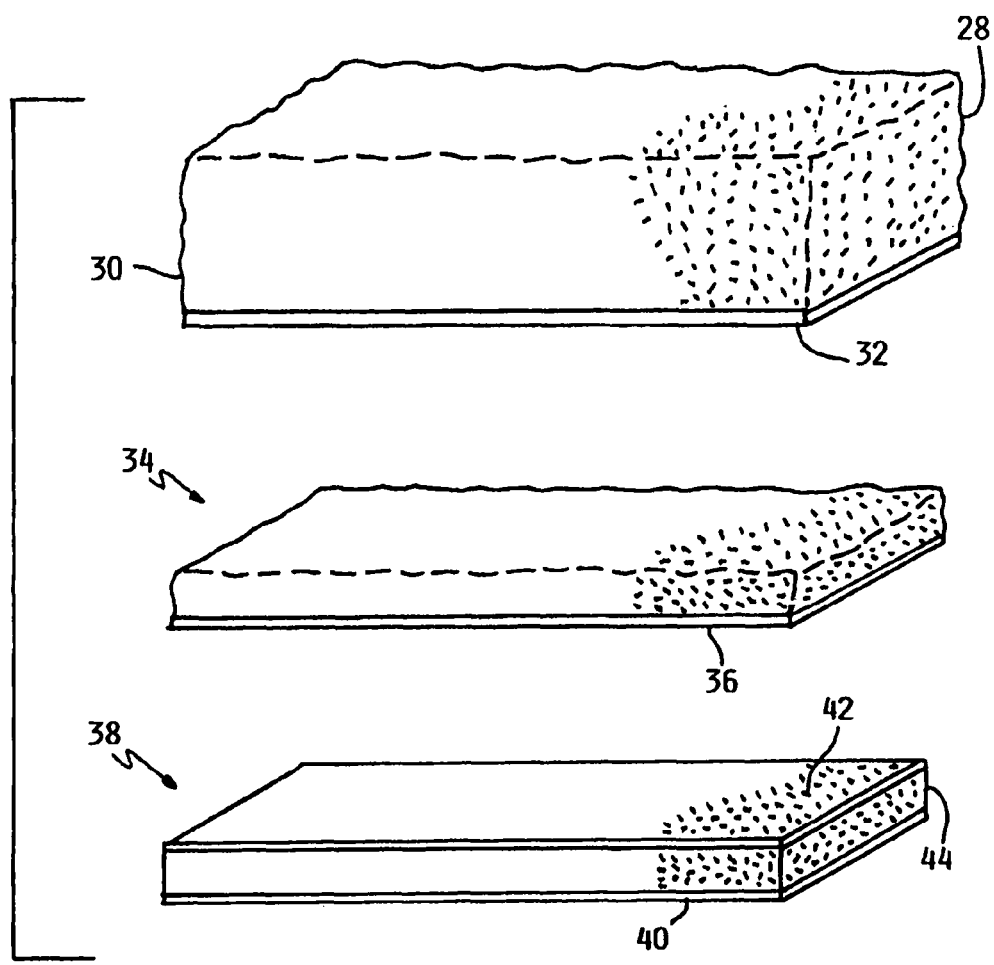
FIG. 2 is a representation of exemplary filters for a reticle pod for a system of the invention and layers thereof.

Preferably, a filter for a reticle pod can be fabricated to exhaust over comparable periods of use. For example, the invention contemplates use of filter layers that concomitantly require maintenance or replacement. In one embodiment, a filter layer comprising a chemisorptive media can be fabricated to be thinner than a layer featuring a physisorptive media as physisorptive medias tend to exhaust prior to chemisorptive medias. A filter employing filter layers that exhaust over comparable periods of use can reduce operation costs by consolidating any potential downtime. FIG. 2 is a representation of exemplary filters for a reticle pod for a system of the invention and layers thereof. As shown, the first 28 and second filter layer 30 can be disposed in communication with each other. For example, the first filter layer can be disposed on a surface of the second filter layer 30. The first and second filter layer can also comprise a cover sheet. As shown, the second filter layer 30 features a cover sheet 32. The cover sheet 32 can be a polyester nonwoven material. Preferably, the first and second filter layer comprise a chemisorptive or physisorptive media for removing contaminants such as volatile silica containing compounds.

In one embodiment, a reticle pod, stocker, library, tool, cleanroom or inspection area for a system of the invention comprises a first filter layer having a physisorptive media. An exemplary physisorptive media can include activated carbon. Activated carbon of a physisorptive media can be untreated or treated and granulated. A system of the invention also features a second filter layer comprising a chemisorptive media. For example, a chemisorptive media for a second filter layer can include a cation exchange resin. Preferably, the cation exchange resin comprises a copolymer such as a divinyl benzene styrene copolymer having at least one acidic functional group.

An exemplary chemisorptive media for a filter layer of a filtering system is a cation exchange resin such as a chemically acidic copolymer. In one embodiment, a physisorptive media for a filter layer can include activated carbon, which can be untreated or treated and granulated. Physisorptive medias can be formed into a block held together by binder materials. Exemplary physisorptive medias can be chemically acid and obtained from organic sources such as coal. As shown, the filter or filter layer 34 in FIG. 3 comprises a cover sheet 36. In one embodiment, the cover sheet comprises a polyester nonwoven material. Preferably, the filter comprises a chemisorptive or physisorptive media. Moreover, a filter 38 comprises a first 40 and second cover sheet 42. The filter 38 also includes a body portion 44 disposed on the first cover sheet.

Exemplary cover sheets of a filter for a reticle pod can comprise filtering or non-filtering nonwoven materials such as polyester, polyamide, polypropylene or any combination thereof. For example, a cover sheet comprising filtering nonwoven materials can remove particulates present in a gas stream passing therethrough. A cover sheet can also be used to retain honeycombed or pleated elements. In addition, a cover sheet can retain given medias such as, for example, activated carbon or beads comprising a sulfonated divinyl benzene styrene copolymer. Preferably, a cover sheet for a filter can comprise chemically inert materials such as, for example, polyester or polypropylene.

Figure 3:
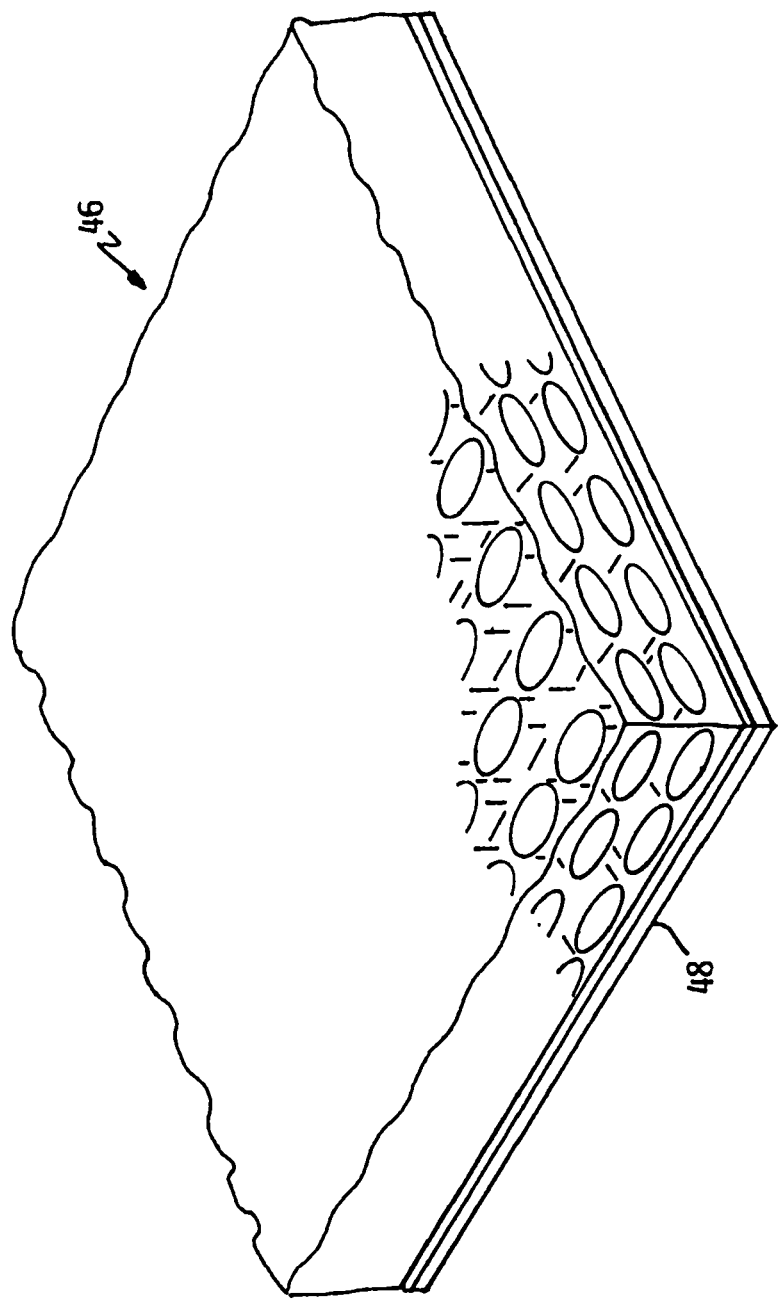
FIG. 3 is a representation of an exemplary filter of a reticle pod for a system of the invention.

For example, a filter for a reticle pod, stocker, library, tool, cleanroom or inspection area of a system of the invention can be retained by any suitable container or framework. Such containers or frameworks are also useful in facilitating filter layer replacement. A filter or layer thereof can comprise a filter member having pleated elements. Pleated elements can increase filter member surface areas, which can aid in removing particulates or contaminants present in a gas flow path passing therethrough. FIG. 3 is a representation of an exemplary filter of a reticle pod for a system of the invention. In one embodiment, the filter layer 46 comprises a high surface area filter member. Moreover, the filter layer can comprise a chemisorptive or physisorptive media and binder type materials. Preferably, a filter layer comprising a high surface area filter member includes a media disposed on, for example, a composite material 48. The binder type material can also be introduced to the media to aid binding thereof.

A first or second filter layer of, for example, a reticle pod can employ a nonwoven composite material comprising at least one cation exchange resin that can bind to airborne contaminants. Exemplary first or second filter layers comprising a chemisorptive media and methods for fabricating such filter layers are generally described in U.S. Pat. Nos. 6,447,584, 6,740,147, 6,610,128 and 6,761,753, the contents of which are hereby incorporated by reference herein. A filter layer can also be fabricated via dry application of chemisorptive media to a nonwoven composite or carver material, which is then heated and calendered.

For example, such a nonwoven composite material can be polyester. In one embodiment, the chemisorptive media is a porous divinyl benzene styrene copolymer including acidic functional groups. Exemplary acidic functional groups include sulfonic and carboxylic acid functional groups. The chemisorptive media can feature a pore size in the range of about 50 to 400 angstroms (Å). Moreover, a surface area of the media can be greater than about 20 squared meters per gram. For example, acidic functional groups of a benzene styrene copolymer can also feature an acidity level higher than about 1 milliequivalent per gram.

In one embodiment, a first or second filter layer comprises chemisorptive media particles distributed throughout a material such as, for example, a nonwoven, fiber matrix or polyester material. Preferably, chemisorptive media particles of a filter layer can include a cation exchange resin. For example, these media particles can be chemically acidic. Such media particles can feature exemplary particle sizes from about 0.3 to 1.2 mm. Moreover, a chemisorptive media particle can, for example, have a porosity and average pore diameter of about 0.3 milliliters per gram and 250 Å, respectively.

A chemisorptive media for a first or second filter layer of a filter for a reticle pod is particularly useful for removing contaminants. Moreover, the chemisorptive media can be capable of removing particulates from a gas stream such as, for example, when particulates are greater in size than media pores. In one embodiment, the first or second filter layer of a reticle pod can comprise a physisorptive media. An exemplary physisorptive media is activated carbon. Activated carbon is generally described by U.S. Pat. Nos. 5,607,647 and 5,582,865, the contents of which are hereby incorporated by reference herein.

Preferably, a physisorptive media for a first or second filter layer of a reticle pod for a system of the invention includes untreated activated carbon. The physisorptive media can alternatively include synthetic carbon materials such as, for example, generally described in U.S. Pat. No. 5,834,114, the contents of which are hereby incorporated by reference herein. Exemplary synthetic carbon materials can also be used in combination with activated carbon for a physisorptive media. In one embodiment, a filter or layer thereof comprising a physisorptive media includes untreated and granulated activated carbon, which is capable of removing contaminants such as volatile silica containing compounds present in a gas stream.

In one embodiment, the system of the invention comprises a purge system associated with a storage housing. The purge system can include a plurality of storage lines, each connected to at least one storage receptacle for a reticle pod. Preferably, the purge system can provide a purge gas comprising CDA or extra CDA to one or more storage receptacles via at least one purge line. The invention also contemplates that the purge system can provide an inert gas such as dry nitrogen or argon to the storage receptacles. For example, purge systems for the preparation of extra CDA are manufactured by Aeronex, Incorporated of San Diego, Calif. Exemplary sources of CDA or extra CDA are also generally described by U.S. Publication Nos. 2005/0017198 and 2006/0118138, the contents of which are hereby incorporated by reference herein.

Figure 4:
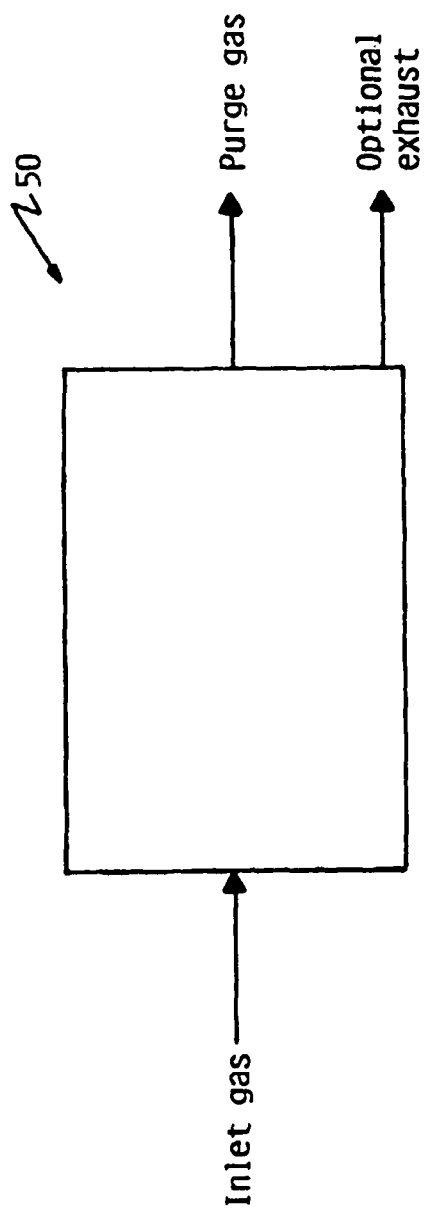
FIG. 4 is a representation of an exemplary purge system for a system of the invention.

FIG. 4 is a representation of an exemplary purge system for a system of the invention. As shown, an inlet gas is introduced to the purge system 50. In one embodiment, the inlet gas can be CDA. For example, an inlet gas comprising CDA can satisfy the specifications of the International Standards Organization (ISO) 8573-1. Generally, these specifications can require the inlet gas to comprise particulate sizes, particulate concentrations, dew points and oil concentrations of about less than 0.1 µm, less than 0.1 mg m$^{-3}$, −20° C. and 0.01 mg m$^{-3}$, respectively. The purge system can also inlet pressure and temperature for CDA from about 0 to 10 barg and about 15 to 33° C. With a CDA inlet gas, exemplary contaminant concentrations are included in Table 1.

TABLE 1

| Contaminants | Concentrations |
| --- | --- |
| Volatile inorganic compounds such as SO$_2$, H$_2$S, H$_2$SO$_4$, HF, HCl and H$_3$PO$_4$ | About 5 ppbv |
| Volatile bases such as NH$_3$, NMP and small amines | About 100 ppbv |
| Condensable organics | About 100 ppbv |
| Water | About 2000 ppbv |
| Refractory compounds such as hydrocarbons containing S, P or Si | About 1 ppbv |

The purge system 50 in FIG. 4 also includes an exit gas that comprises a purge gas for one or more storage receptacles. In one embodiment, the purge gas from the purge system can comprise a purge gas source. For example, the purge gas source can comprise CDA or extra CDA. With a purge gas source comprising extra CDA, exemplary contaminant concentrations are included in Table 2.

TABLE 2

| Contaminants | Concentrations |
| --- | --- |
| Volatile inorganic compounds such as SO$_2$, H$_2$S, H$_2$SO$_4$, HF, HCl and H$_3$PO$_4$ | About <0.001 ppbv |
| Volatile bases such as NH$_3$, NMP and small amines | About <1 ppbv |
| Condensable organics | About <0.1 ppbv |
| Water | About <1 ppbv |
| Refractory compounds such as hydrocarbons containing S, P or Si | About <0.001 ppbv |

Preferably, the pressure drop of the purge system can be less than about 1 bar. The purge gas can exit the purge system at a pressure and temperature of from about 6 to 7 barg and about 15 to 34° C. A flow rate of the purge gas from the purge system can also be about 300 liters per minute.

Figure 5A:
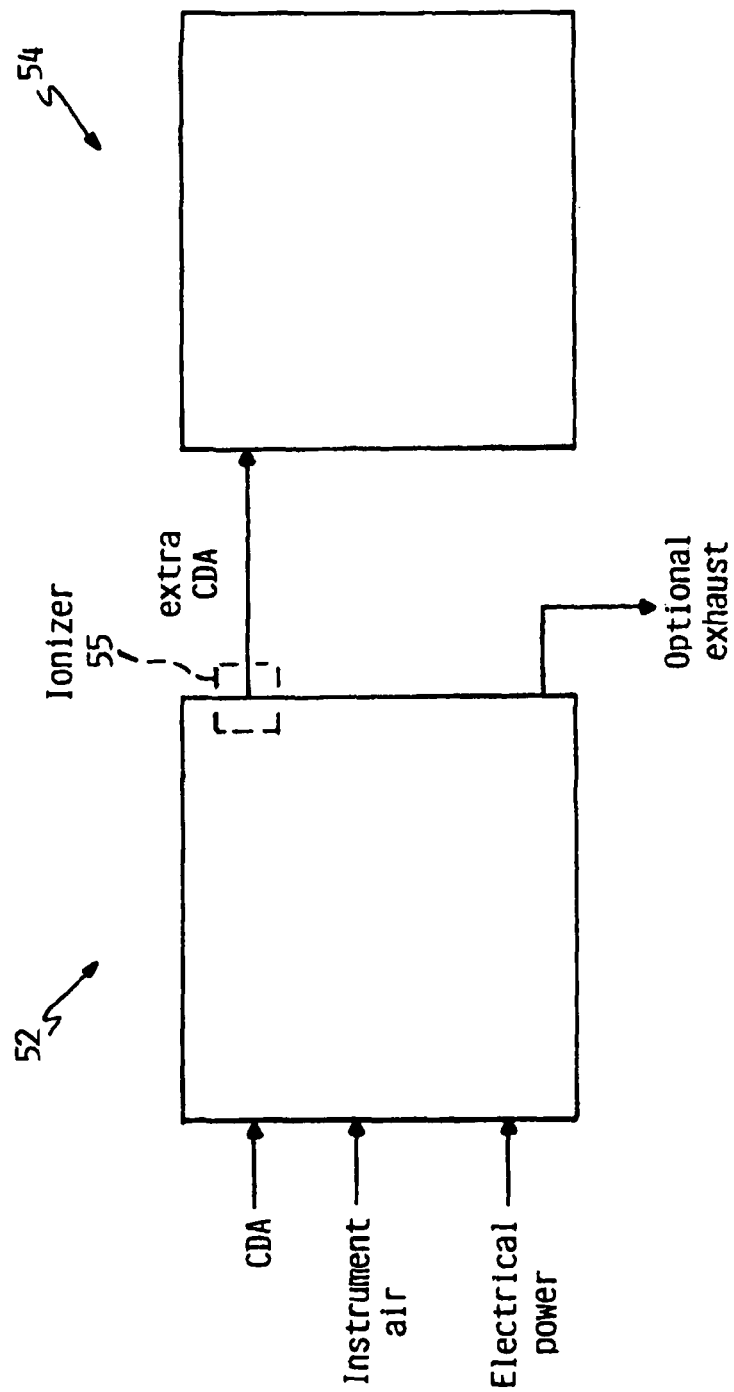
FIG. 5a is a representation of an exemplary purge system for a system of the invention.

The purge system 50 in FIG. 4 can also comprise an optional exhaust. FIG. 5a is a representation of an exemplary purge system for a system of the invention. As shown, an inlet gas is introduced to the purge system 52. Preferably, the inlet gas can be CDA. For example, an inlet gas can comprise CDA. The purge system can also include an optional exhaust and instrument air, electrical power sources, or inputs. Moreover, the purge system can include an exit gas that comprises a purge gas for one or more storage receptacles. The purge system can comprise a purge gas source associated with a storage housing 54. In one embodiment, a purge gas source exits the purge system and can be introduced to the storage housing 54 through one or more purge lines. An ionizer 55 can be added on a purge outlet line or in the purge system. The purge gas source can also comprise extra CDA. Inlet and outlet gases that comprise CDA and extra CDA can be as described herein such as, for example, in Table 1 and 2, respectively.

Figure 5B:
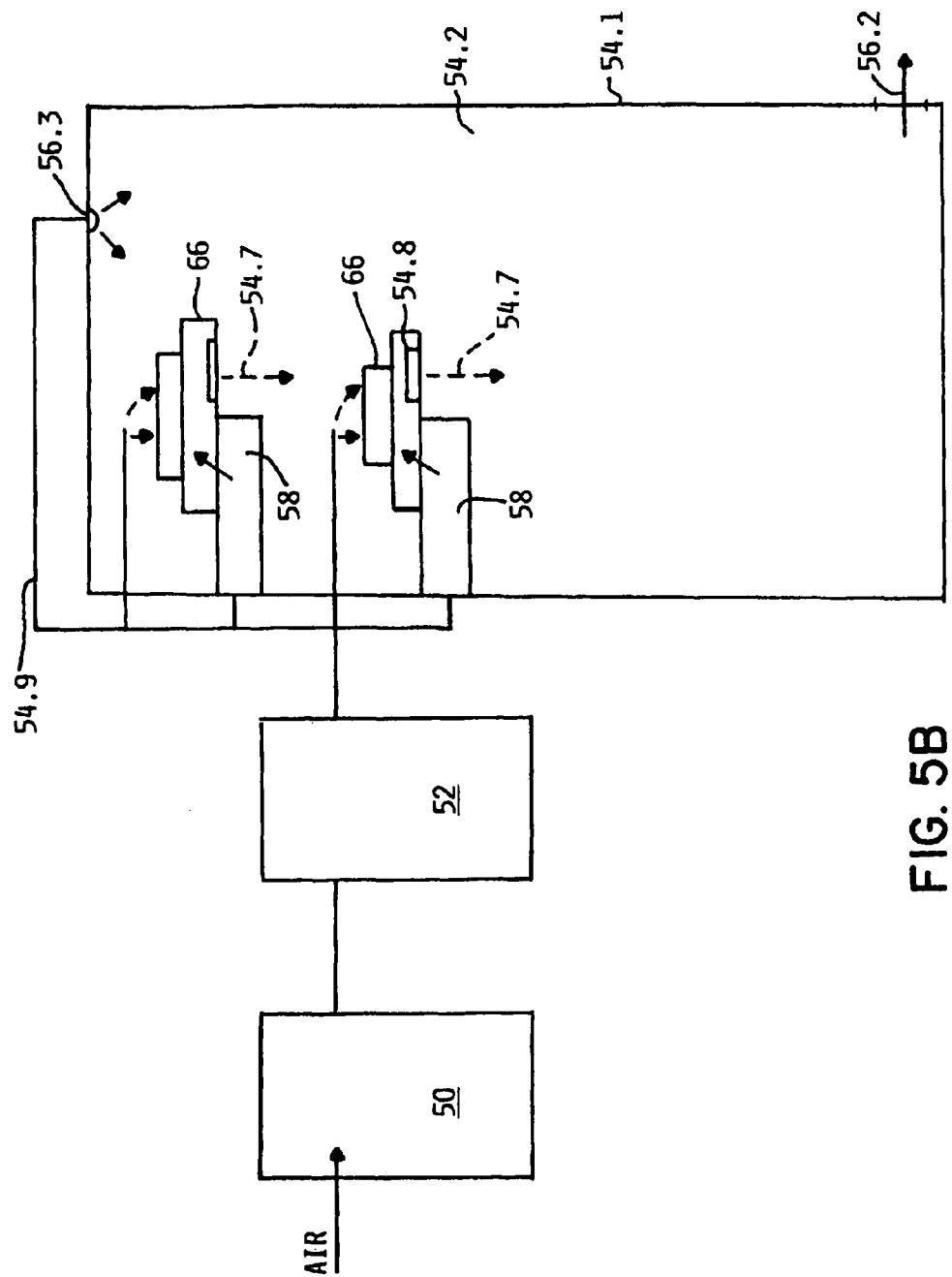
FIG. 5b is a representation of an exemplary purge system for a system of the invention.

Referring to FIG. 5b, one or two purge systems 50, 52 providing CDA or extra CDA connect to a storage housing, such as a reticle pod stocker 54.1. The stocker has receptacles 58 configured as shelves which are plumbed with the purge lines to provide the purge CDA or extra CDA into the reticle pods seated on the receptacles. The pods individually exhaust the purge CDA or extra CDA into the enclosed interior environment 54.2 of the reticle pod stocker 54.1 as indicated by the arrow 54.7. A getter or desiccant 54.8 is in the reticle pod as a filter 54.8 and is in the purge flow stream whereby it is effectively recharged, dehumidified, from the purge stream of CDA or extra CDA. Additionally, as indicated by the further purge lines 54.9, the reticle pods may also be washed with the CDA or extra CDA. The storage housing, configured as the reticle pod stocker may exhaust the enclosed interior environment as indicated by the exhaust arrow 56.2. Typically such exhaust is preferably in the lower region of the housing and the supplemental inlets 56.3 are in the upper region of the housing.

In one embodiment, a purge system for a system of the invention comprises a plurality of purge lines. For example, a purge line of a purge system can be connected to at least one storage receptacle. Preferably, a shelf of a storage housing can comprise a plurality of storage receptacles. FIG. 6 is a representation of exemplary shelves for a system of the invention comprising a plurality of storage receptacles. As shown, the shelf 56 comprises a plurality of storage receptacles 58. Although the shelf in FIG. 6 includes four storage receptacles configured to receive reticle pods, the invention contemplates any other suitable number of receptacles. Each of the storage receptacles can be configured to receive a reticle pod. The reticle pod comprises at least one inlet, for example, an inlet port, that connects to one or more purge lines.

The shelf 56 in FIG. 6 can be associated with connections 60 for at least one purge line. The connections can introduce a purge gas source comprising, without limitation, CDA or extra CDA to the shelf. In one embodiment, the shelf can comprise passages 62 that can provide a purge gas source to a storage receptacle 58. Preferably, the passages associated with the shelf can each comprise an outlet 64. Exemplary outlets of the shelf can be associated with one or more storage receptacles. As shown, the outlets of the shelf can be configured to connect or be coupled to an inlet port, an outlet port or combination thereof of a reticle pod. For example, the storage receptacles of the shelf receive a reticle pod comprising at least one inlet port for introduction of a purge gas source. With the reticle pod received by the storage receptacle, the inlet port of the pod can be associated with at least one outlet of the shelf.

Further disclosure relating to these and related aspects of the invention are disclosed in Provisional Application Ser. No. 60/892,196, entitled Purge System for a Reticle SMIF Pod owned by the owner of in the instant invention. Said application is incorporated herein by reference. Said disclosure illustrates a purge connection option between the reticle pods and storage receptacle. An exemplary connection system between the receptacle portion and the reticle pod can be an elastomeric grommet as the purge inlet on the door of the reticle pod that cooperates with a metal nozzle, the purge outlet on the shelf of the storage receptacle.

In one embodiment, an inlet port of a reticle pod can be connected to one or more purge lines. For example, an inlet port can be connected or associated with a purge line for introducing a purge gas source through one or more connections 60, passages 62 and outlets 64 of the shelf 56 in FIG. 6. As described, a purge line can be connected to a purge system associated with a storage housing comprising the shelf. Preferably, the association of a purge line with an inlet port for a reticle pod received by a storage receptacle can be facilitated by automated means such as, without limitation, conventional programmed computer systems and devices that can execute programs directing the manipulation of reticle pods and shelves. A person of ordinary skill in the art can select exemplary programmed computer systems and devices to connect the inlet of a reticle pod to a purge line.

Figure 6A:
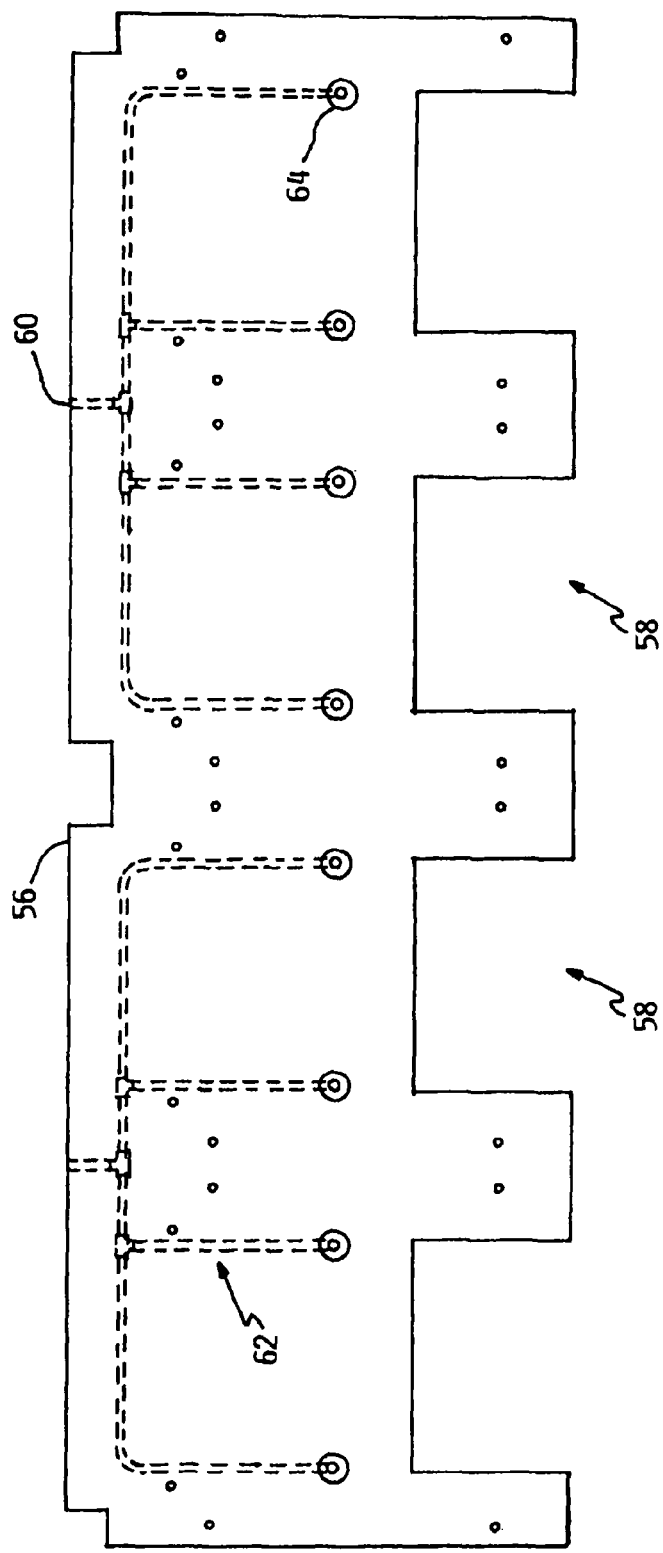
FIG. 6a is a plan view of exemplary shelves of a storage receptacle in accord with the invention.
Figure 6B:
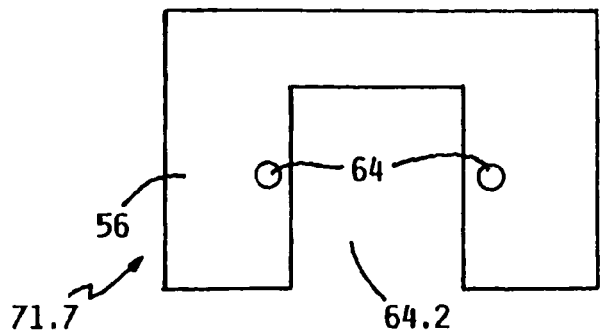
FIG. 6b is a plan view of an alternate storage receptacle configured as a U-shape with purge outlet ports on adjacent sides of the opening.
Figure 6C:
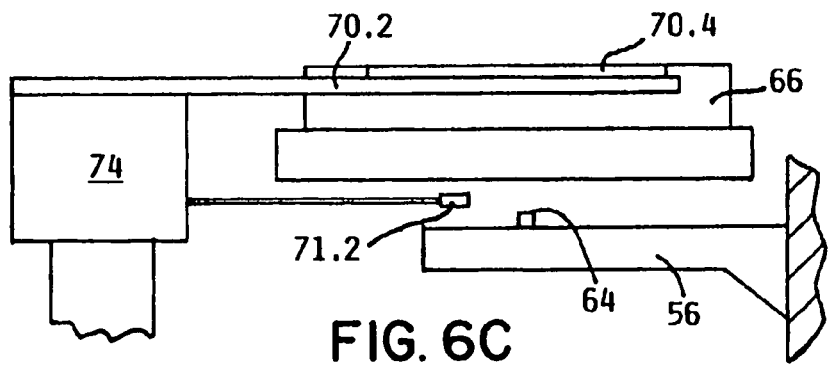
FIG. 6c is an elevational view of a robotic gripper engaged with a reticle pod and with an airflow sensor.
Figure 6D:
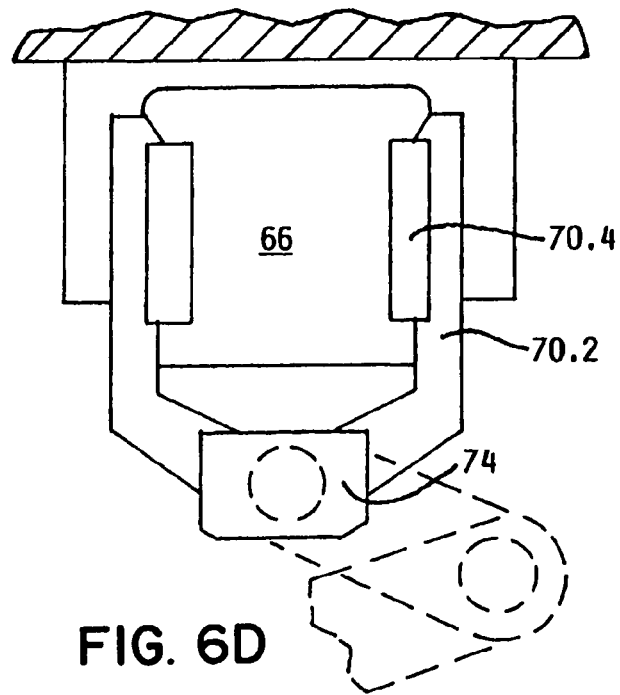
FIG. 6d is a plan view of the gripper, reticle pod and receptacle of FIG. 6c.

Referring to FIGS. 6b, 6c, and 6d, a further embodiment of a reticle storage receptacle is shown. A shelf with a U-shape defines a void 64.2 and has purge outlets 64. An automated robotic device with a gripper 70.2 grabs the reticle pod at the flange 70.4. An air flow sensor 71.2 is associated with the gripper and is utilized to confirm purging air flow. Said confirmation can be done before the reticle pod 66 is seated on the receptacle 71.7 or after the pod is seated.

FIG. 7 are representations of exemplary reticle pods received by reticle storage receptacles associated with shelves of the type in FIG. 6a or 6b. As shown, one or more reticle pods 66 can be disposed on a shelf 68 of a storage housing 70. In one embodiment, the storage housing comprises a plurality of shelves. For example, each of the shelves can include at least one reticle storage receptacle. The reticle pods in FIG. 7 can each be received by a storage receptacle of the shelf. Preferably, the reticle pods comprise an inlet port that can connect to at least one of the purge lines. Exemplary purge lines can be disposed in the space 72 of the storage housing and provide a purge gas source to the reticle pod. The purge lines can also be connected or associated with the shelf and its passages or outlets.

Figure 7A:
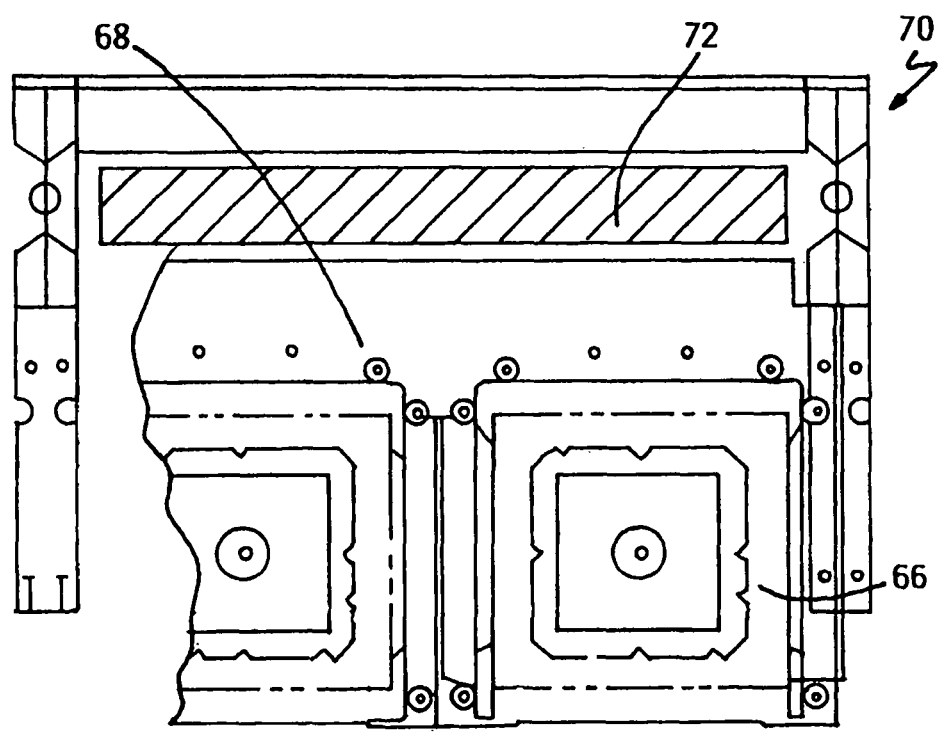
Figure 7B:
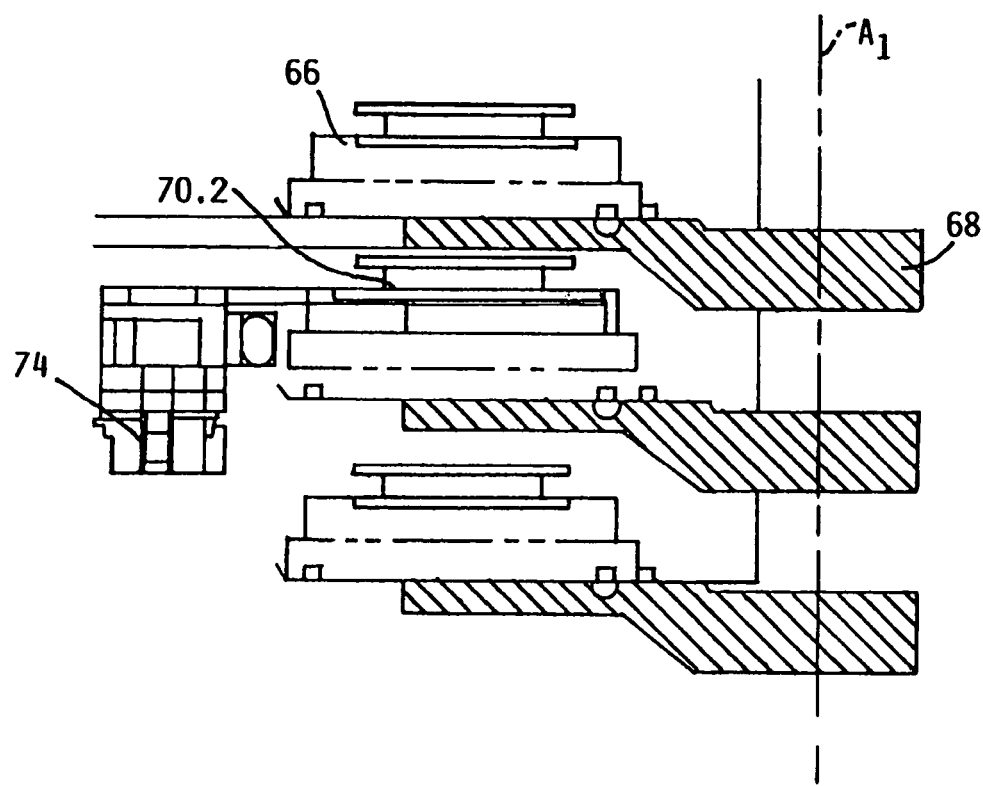
FIG. 7b is a side elevational view of three shelves stacked.
Figure 7C:
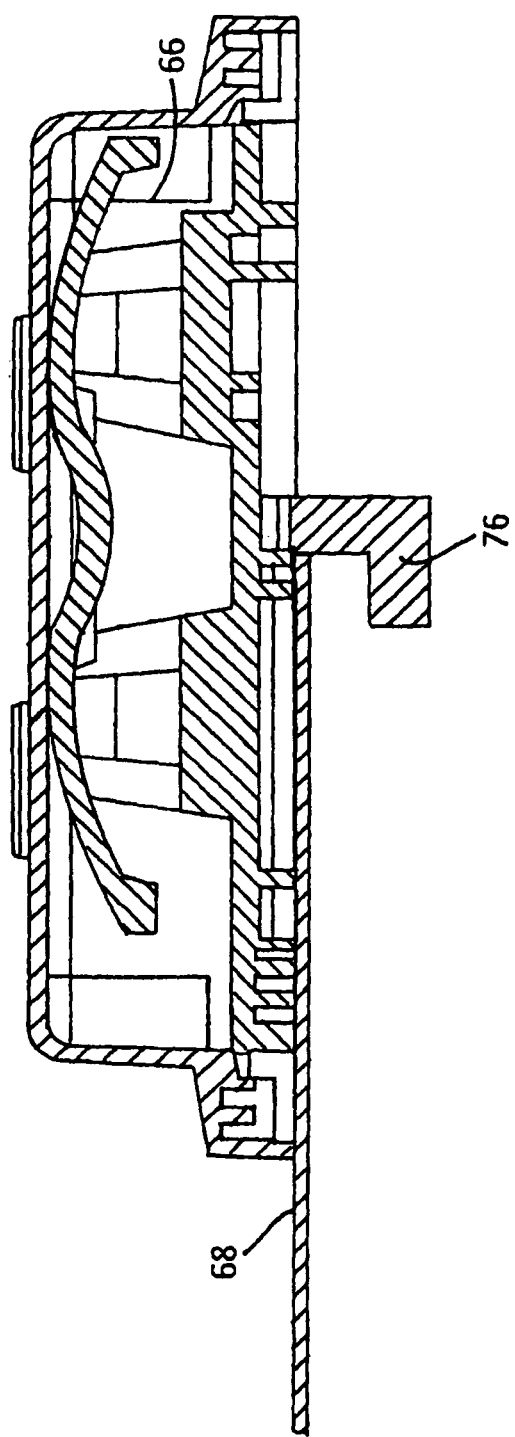
FIG. 7c is a cross-sectional view of a reticle pod seat on a receptacle.

The reticle pods 66 in FIGS. 7a, 7b, 7c can also be manipulated by an automated device 74 with gripper 70.2. Conventional automated devices include those for reticle storage and transport as generally described by U.S. Pat. Nos. 6,991,416; 6,364,595; 7,039,499; and U.S. Publication No. 2006/0078407, the contents of which are hereby incorporated by reference herein. The system and methods of the invention can each comprise one or more automated devices, which may be used for reticle storage and transport. For example, the storage housing 72 can also include access to the reticle pods through conventional ports or doors. Preferably, a series of doors can be used to permit auxiliary manual access to the reticle pods and reticles therein. The storage housing can also comprise a circulation system, which may wash or flow purge gases such as CDA, extra CDA, or other inert gases past the reticle pods to prevent contaminants from accumulating thereon and to minimize absorption of moisture by the reticle pods at their exterior. The circulation system can be capable of providing positive pressure within the storage housing with one door open, thereby preventing contaminants from entering the housing through the open door.

In one embodiment, a reticle storage receptacle can be configured to receive a reticle pod having an inlet that connects or is associated with at least one purge line. For example, the reticle pod 66 in FIGS. 7a, 7b, and 7c is received by a storage receptacle of a shelf 68 and purge lines associated therewith can provide a purge gas source to the pod. As shown, a purge gas source is connected or associated with the shelf through a purge line 76 and can communicate with the reticle pod disposed thereon. Preferably, the shelf comprises an outlet for the purge gas source provided through the purge line. Exemplary outlets for the shelf can be configured to connect or be coupled to an inlet of a reticle pod. The inlet of the reticle pod can be an inlet port connected or associated with the purge line through one or more connections, passages and outlets of the shelf.

Furthermore, the system of the invention comprises a storage housing having a plurality of reticle storage receptacles. The storage housing for a system of the invention can be any conventional storage housing including those with automation as generally described by U.S. Pat. Nos. 6,562,094 and 6,848,876 and U.S. Publication No. 2004/40158348, the contents of which are hereby incorporated by reference herein. Generally, a storage housing can be used for the safe and efficient storing of reticles or reticle pods in a clean environment. In one embodiment, reticle pods are received by a plurality of storage receptacles disposed in the storage housing for a system of the invention. The storage housing minimizes the amount of contaminants that can contact reticle pods or reticles therein.

A storage housing for a system of the invention can also be associated with a retrieval unit. The retrieval unit can be separate or incorporated with the storage housing for accessing and staging reticle pods. An exemplary retrieval unit comprises the robot end effector reticle shield of FIG. 23. The storage unit can also comprise movable shelves having a plurality of storage receptacles for receiving reticle pods. For example, the shelves can be selectively moved by a drive mechanism that is associated with the storage housing. In one embodiment, the storage housing can be hermetically enclosed except during reticle pod retrieval and transport operations. The storage housing can also be substantially free of motors, moving parts, circuitry and other contaminant generating components. These features can also be external to the storage housing.

Referred to FIG. 7b, the shelves may be swiveable about an axis A1 to provide flexibility in storage.

Figure 8A:
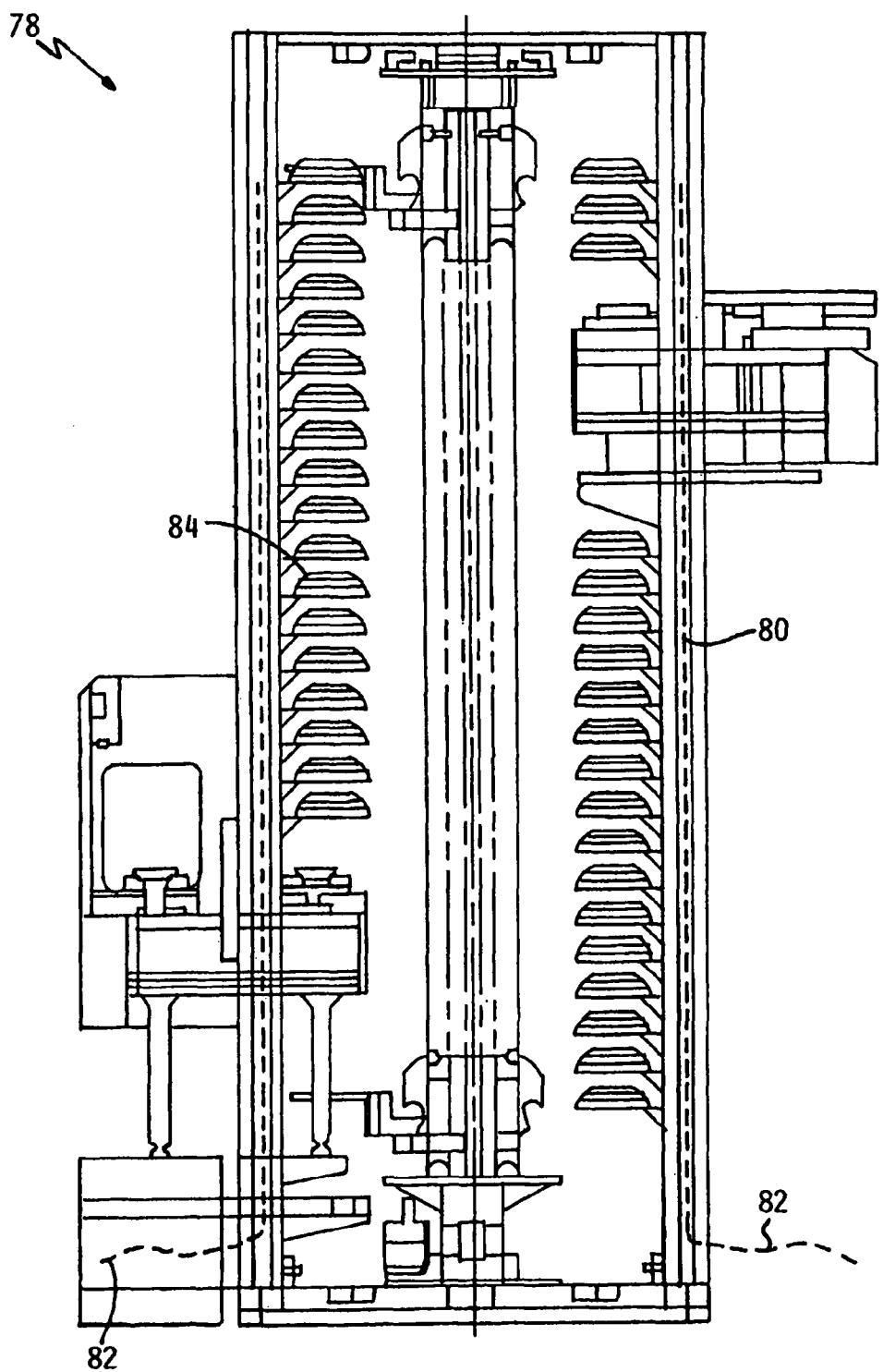
FIG. 8A is a representation of an exemplary storage housing for a system of the invention.

Preferably, the storage housing can permit a purge gas to circulate uniformly throughout an interior thereof. By uniformly circulating a purge gas such as CDA or extra CDA throughout the storage unit, the amount of potential contaminants exposed to the reticle pods and reticles therein can be minimized. FIG. 8A is a representation of an exemplary storage housing for a system of the invention. As shown, the storage housing 78 comprises a plurality of reticle storage receptacles associated with a plurality of shelves 80. In one embodiment, a purge system can be associated with the storage housing. Exemplary purge systems can comprise a plurality of purge lines. Purge lines 82 in FIG. 8A provide a purge gas source to reticle pods 84 along both banks of the storage housing. The purge gas source can comprise a source of CDA or extra CDA for removing contaminants from a reticle pod or reticle.

As shown, the purge lines 82 are each connected to one of the reticle storage receptacles of the shelves 80. The storage receptacles are configured to receive the reticle pods 84 in which a reticle can be disposed. In one embodiment, the storage housing 78 can comprise a plurality of shelves, which each include a plurality of storage receptacles. The storage housing in FIG. 8A also comprises conventional devices and components for storage and transport of reticle pods and reticles therein. Preferably, a reticle storage receptacle can be configured to receive a reticle pod having an inlet that connects or is associated with at least one purge line. A purge gas source can be connected or associated with a shelf through a purge line. Moreover, a purge gas source can communicate with a reticle pod disposed on a shelf. An exemplary shelf comprises an outlet for the purge gas source provided through the purge line.

Figure 8B:
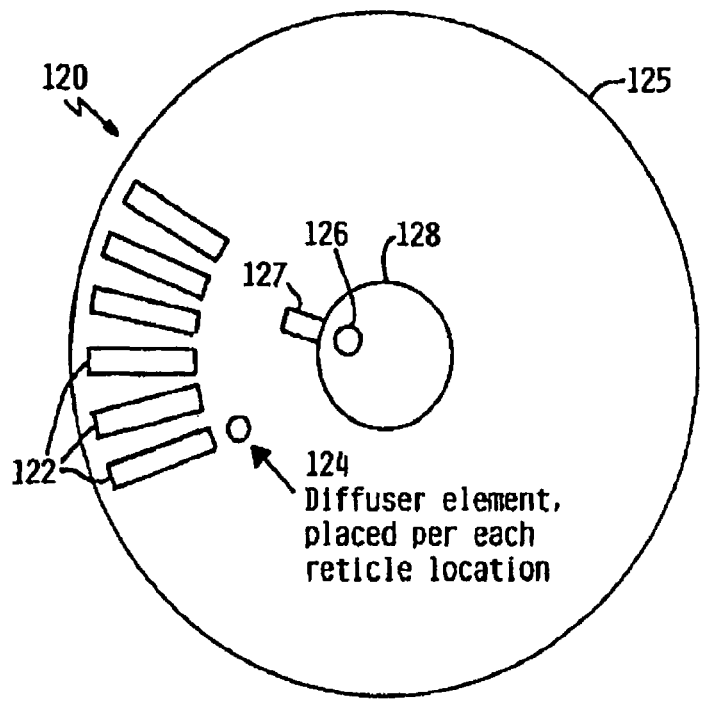
FIG. 8B is a top view of a carousel reticle stocker.
Figure 8C:
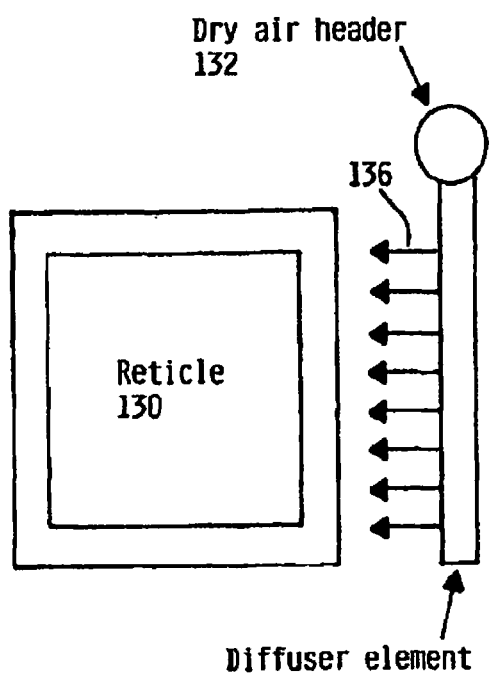
FIG. 8C illustrates a detailed view of a diffuser for the purge system of a reticle stocker.

A preferred embodiment of the invention provides for the purging of a bare reticle stocker. Such a system 120 is illustrated in FIG. 8B and involves storage of a number of reticles in either a linear system in which a robot delivers or retrieves reticles from a storage location as described elsewhere herein, or uses a carousel system that rotates to position each storage location relative to a vertically translated robotic delivery and retrieval system. The "bare" reticle can be stored and moved with a pellicle attached thereto, or alternatively, the reticle can be stored with the pellicle in a plastic sleeve. This system 120 includes a plurality of reticle storage locations 122 distributed in a carousel housing 125. A robotic transport system 128 can include a purge delivery system 126 that can purge reticles during transport with robotic arm 127. Each location 122 can have a diffuser element 124 associated with it. As shown in FIG. 8C, each location can have a reticle 130 positioned in proximity to a header 132 that delivers CDA or extra CDA in a stream 136 that extends horizontally and/or vertically across the reticle location. The purge system can also be integrated into the robotic transport assembly 128.

Figure 8D:
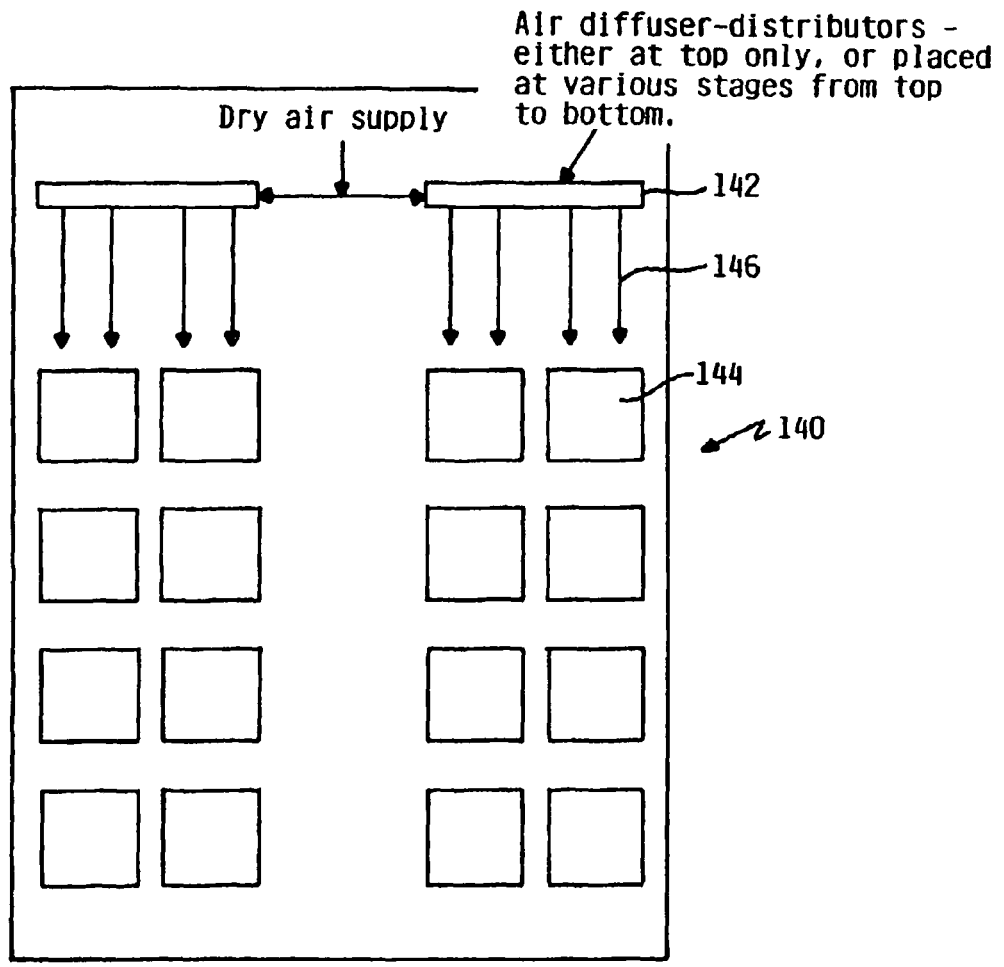
FIG. 8D is a side view of another preferred embodiment of a purge system for a reticle stocker.

Another preferred embodiment of a purge system for a bare reticle stocker is shown in FIG. 8D. In this system 140, diffusers 142 are placed above reticles 144 to direct CDA or extra CDA 146 down across the surfaces of the reticles. The diffuser 142 can be placed above all the shelf locations or a number of diffusers can be positioned between the shelf locations.

Figure 8E:
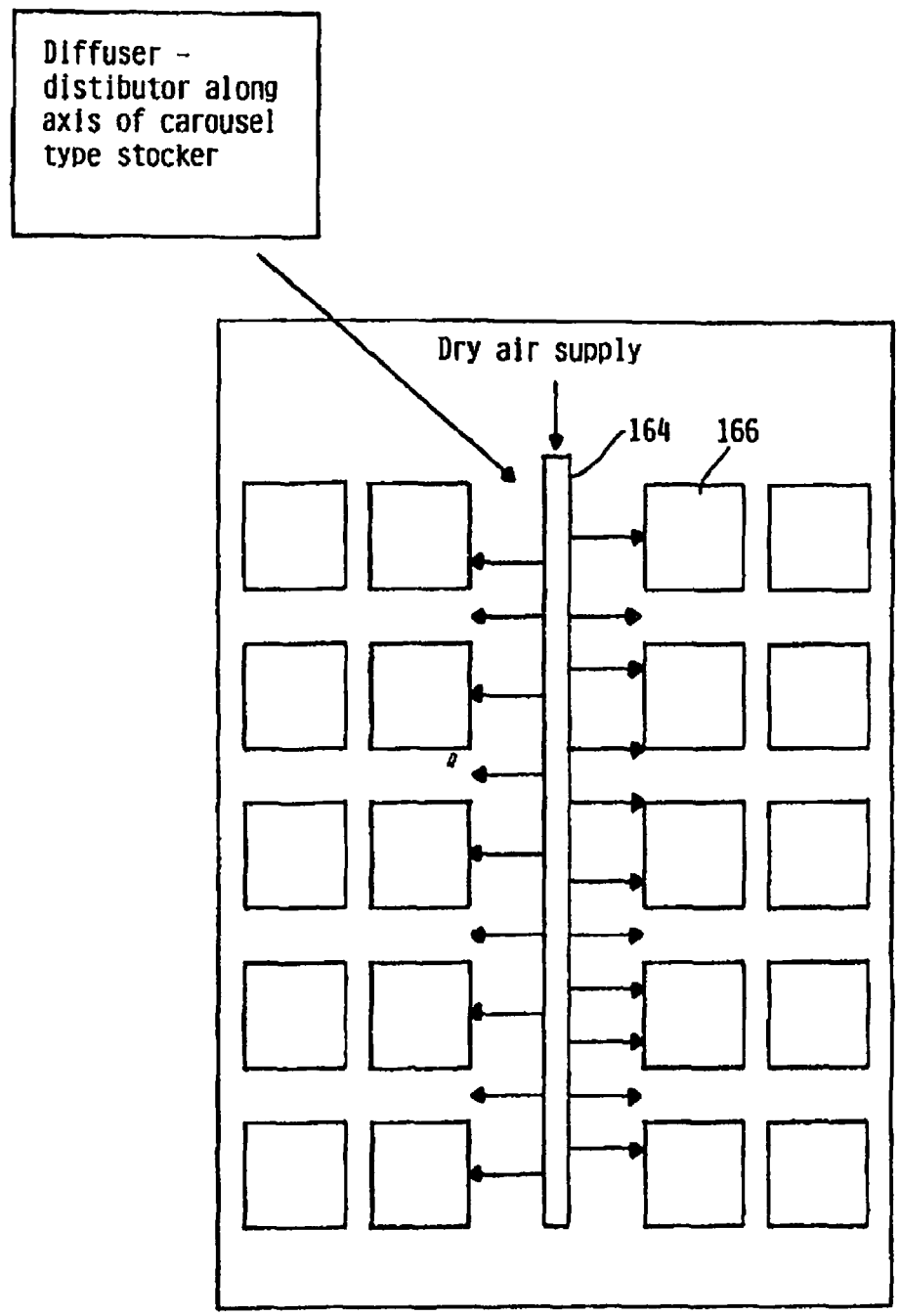
FIG. 8E illustrates a vertically distributed purge system for a reticle storage.

In FIG. 8E, the diffuser 164 can have a number of ports distributed vertically along the diffuser element 164 to direct CDA or extra CDA at various shelf locations where reticles 166 are stored. The diffuser can also be incorporated into the robotic system that transports the reticle to and from an interface station so that the reticle can be purged while being removed or inserted into the system 140.

Figure 9:
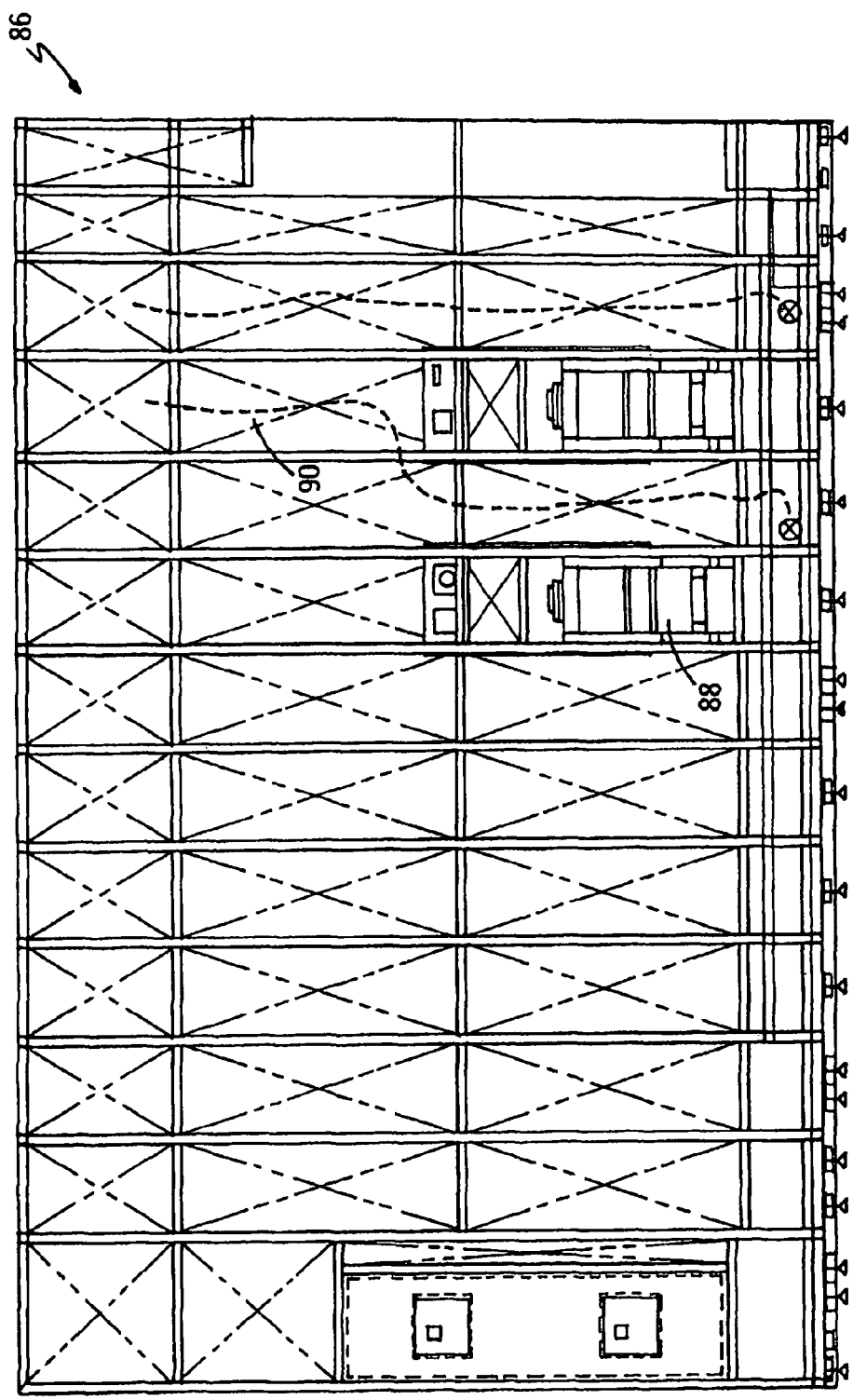
FIG. 9 is a representation of an exemplary enclosure comprising a plurality of storage housing of the type in FIG. 8.

Outlets of a shelf can also be configured to connect or be coupled to an inlet of a reticle pod. The inlet of the reticle pod can be an inlet port connected or associated with the purge line through one or more connections, passages and outlets of the shelf. In one embodiment, a system of the invention comprises a plurality of storage housings disposed in a conventional enclosure. FIG. 9 is a representation of an exemplary enclosure comprising a plurality of storage housings of the type in FIG. 8A. As shown, the enclosure 86 can have one or more storage housings 88 disposed therein. In one embodiment, a purge system can be associated with the storage housings of the enclosure. Exemplary purge systems can comprise a plurality of purge lines. Purge lines 90 in FIG. 8A provide a purge gas source to reticle pods associated with each storage housing. The purge gas source can comprise a source of CDA or extra CDA for removing contaminants from a reticle pod or reticle within the storage housing of the enclosure. The enclosure and storage housing in FIG. 9 also can comprise conventional devices and components for storage and transport of reticle pods and reticles therein.

For example, a conventional device can be positioned within the enclosure for removing reticles from and replacing reticles in each housing. The device can be a standard robotic device that includes a drive system. A controller for controlling the drive system of the robotic device can calculate a profile of a commanded motion before the motion is performed. The controller can also recalculate a profile multiple times until the controller determines the motion to be performed. The robotic device can also include a gripper arm for gripping the reticle pods in the storage housing. The gripper arm is driveable by a gripper arm drive for movement away from and towards the storage housing. The robotic device can comprise a vertical column to which the gripper arm is movably mounted. Vertical movement of the gripper arm relative to the vertical column can be provided by a vertical drive. The robotic device can also include a carriage to which the vertical column is rotatably mounted.

Rotary motion of the vertical column is capable of being provided by a rotary drive. A counterbalance for counterbalancing the gripper arm can also be housed within the vertical column to minimize contaminant generation and to be positioned near the center of mass of the robotic device. The drive system includes a bottom drive for driving the carriage of the robotic device alongside the storage housings of the enclosure. For example, the storage housings can be positioned in linear rows within the enclosure. In one embodiment, the drive system can include a top drive so that the robotic device can be driven from the top and the bottom, thereby providing precise vertical orientation. The robotic device can also include a vision system for determining whether a storage receptacle of the storage housing is occupied or empty, positions of the gripper relative to the receptacle and whether the gripper is correctly gripping a reticle pod or reticle.

The enclosure also can include a robot service location for servicing the robotic device. The robot service location is capable of being isolated from the storage housings to prevent contamination of the reticle pods or reticles therein during service of the robotic device. A pod opening system can also be associated with the enclosure and, preferably, storage housings for placing reticles into and removing reticles from the reticle pods with the robotic device. Exemplary robotic devices can be capable of selecting and transporting reticle pods and reticles within the enclosure and storage housings.

In one embodiment, a robotic device can provide for movement of reticle pods and reticles among different storage housings. Preferably, standard robotic devices can also be used to transport reticle pods, reticles or combinations thereof to a reticle storage bay associated with a semiconductor tool. Such semiconductor tools can include lithography, etching, deposition or implantation tools.

In one embodiment, a reticle storage bay associated with a semiconductor tool can comprise each of the features for purging contaminants that are disclosed herein. For example, the reticle storage bay can be connected to a purge line for providing a purge gas. The purge line can comprise an ionizer. Furthermore, the semiconductor tool associated with the reticle storage bay can comprise a purge line connected to a reticle fixture therein. Preferably, a semiconductor tool or reticle storage bay can be associated with one or more purge systems. A reticle storage bay for a system of the invention can include the purge components of a storage housing and enclosure. A system of the invention can also comprise a plurality of reticle storage bays or semiconductor process tools and combinations thereof.

Figure 10:
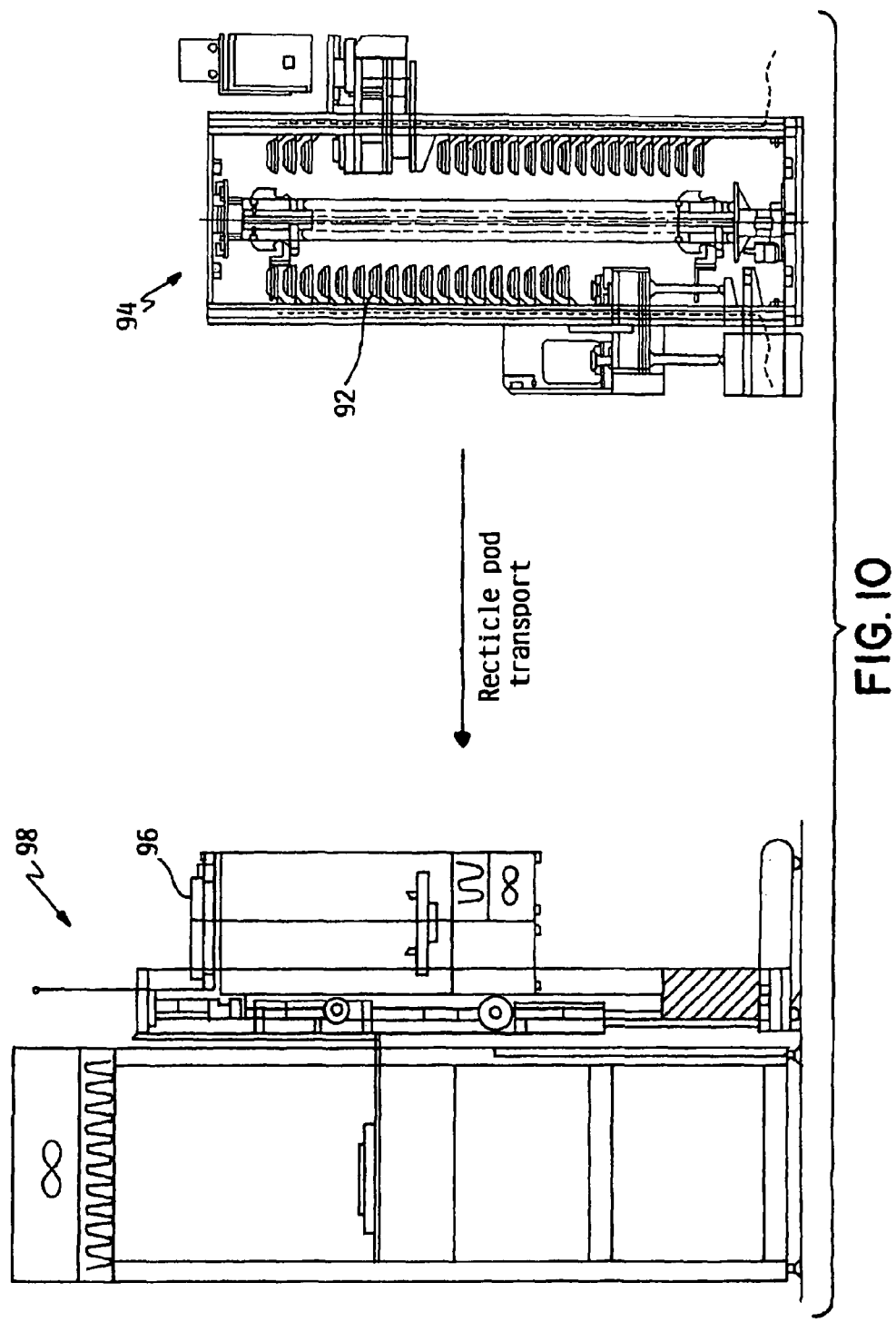
FIG. 10 is a representation of an exemplary semiconductor tool comprising a reticle storage bay and the storage housing in FIG. 8.

FIG. 10 is a representation of an exemplary semiconductor tool comprising a reticle storage bay and the storage housing in FIG. 8. As shown, reticle pods 92 or reticles can be transported from a storage housing 94 to a reticle storage bay 96 associated with a semiconductor tool 98. For example, a reticle storage bay can be associated with a conventional semiconductor process tool such as lithography, etching, deposition or implantation tools. In order to transfer reticles between a reticle pod and a semiconductor tool within a manufacturing facility, a pod is typically loaded either manually or by automated devices on a load port of the tool. To transfer reticles, an optional input and output device can be provided for receiving the reticles and separating the reticle pod. For example, a handling device can be used to transfer the reticle from the door of the reticle pod onto a surface within a clean environment. Additional devices can also be used to transfer the reticle within the tool.

In one embodiment, reticle pods for a reticle can be compatible with standard cleaning agents used with lithography tools. Examples of materials for a reticle pod include fiber reinforced molded polymers or polytetrafluoroethylene (PTFE) coated metals such as aluminum or titanium. The invention also contemplates any suitable materials for a reticle pod. Preferably, a device for transitioning a reticle from atmospheric pressure to vacuum in a semiconductor tool can be provided. The invention also contemplates a reticle protection and transport system. For example, an indexer that stores a plurality of reticles in a storage bay can be provided.

Figure 11:
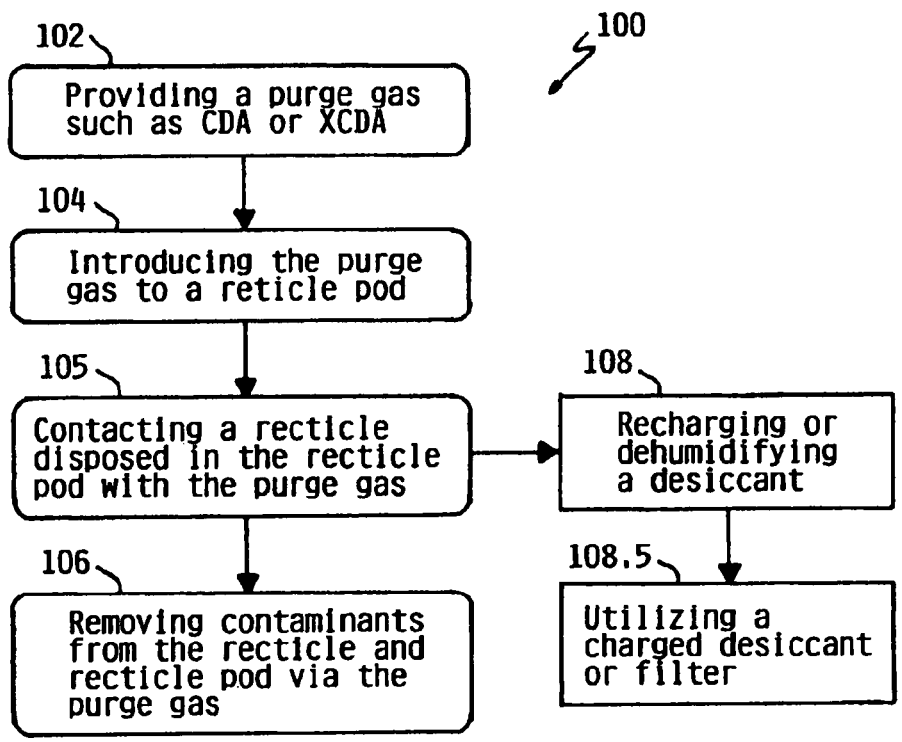
FIG. 11 is a representation of an exemplary method of the invention for purging reticle storage.

A reticle storage bay associated with a semiconductor tool can also comprise a series of doors for providing auxiliary manual access to the reticle pods or reticles therein. A gas circulation system can flow filtered gases past reticle pods or reticles to prevent contaminants from accumulating thereon. FIG. 11 is a representation of an exemplary method of the invention for purging reticle storage. The invention provides a method for purging reticle storage, which can be continuous. Alternatively, the purging can be "most of the time" defined as more than half of the time at issue. Or "substantially continuously" defined as 90% of the time at issue. Preferably, the method 100 includes providing a gas comprising CDA or extra CDA in step 102. In one embodiment, the purge gas can be provided through at least one purge line to the reticle storage receptacle of the storage housing for a system of the invention. Furthermore, the method comprises introducing the gas to a reticle pod received by the reticle storage receptacle in step 104. The method comprises contacting a reticle disposed in the reticle pod with the gas comprising CDA or extra CDA in step 105. The method also comprises removing contaminants from the reticle and reticle pod via the purge gas in step 106. The method also comprises recharging a getter, desiccant, or filter as the reticle pod is being purged a step 108. And, having a fully "charged" or "fresh" desiccant, getter, or filter in the reticle pod when the reticle is present and purging is not occurring. See step 108.5.

In a preferred embodiment, the invention includes maintaining the reticle in a continually purge status with extra CDA, when possible, and when not possible, having the reticle in proximity to a dessicant and/or getter.

In another embodiment the invention includes maintaining the reticle in a substantially continually purge status with at least CDA when the reticle is in a reticle pod and in a storage housing, such as a reticle pod stocker. Moreover, when the reticle in the reticle pod is not being purged, for example when it is being transported, the reticle is in proximity to a dessicant and/or getter in the reticle pod. Moreover, the reticle when removed from the reticle pod is substantially continually washed with at least CDA. Moreover, the dessicant and/or getter may be capable of being recharged as the reticle pod is being purged.

In another embodiment the invention includes maintaining the reticle in a most of the time purge status with at least CDA when the reticle is in a reticle pod and in a storage housing, such as a reticle pod stocker. Moreover, when the reticle is not being purged in a reticle pod, for example when the reticle is being transported, the reticle is in proximity to a dessicant and/or getter in the reticle pod. Moreover, the reticle when removed from the reticle pod is washed most of the time with at least CDA. Moreover, the dessicant and/or getter may be capable of being recharged as the reticle pod is being purged.

Figure 12:
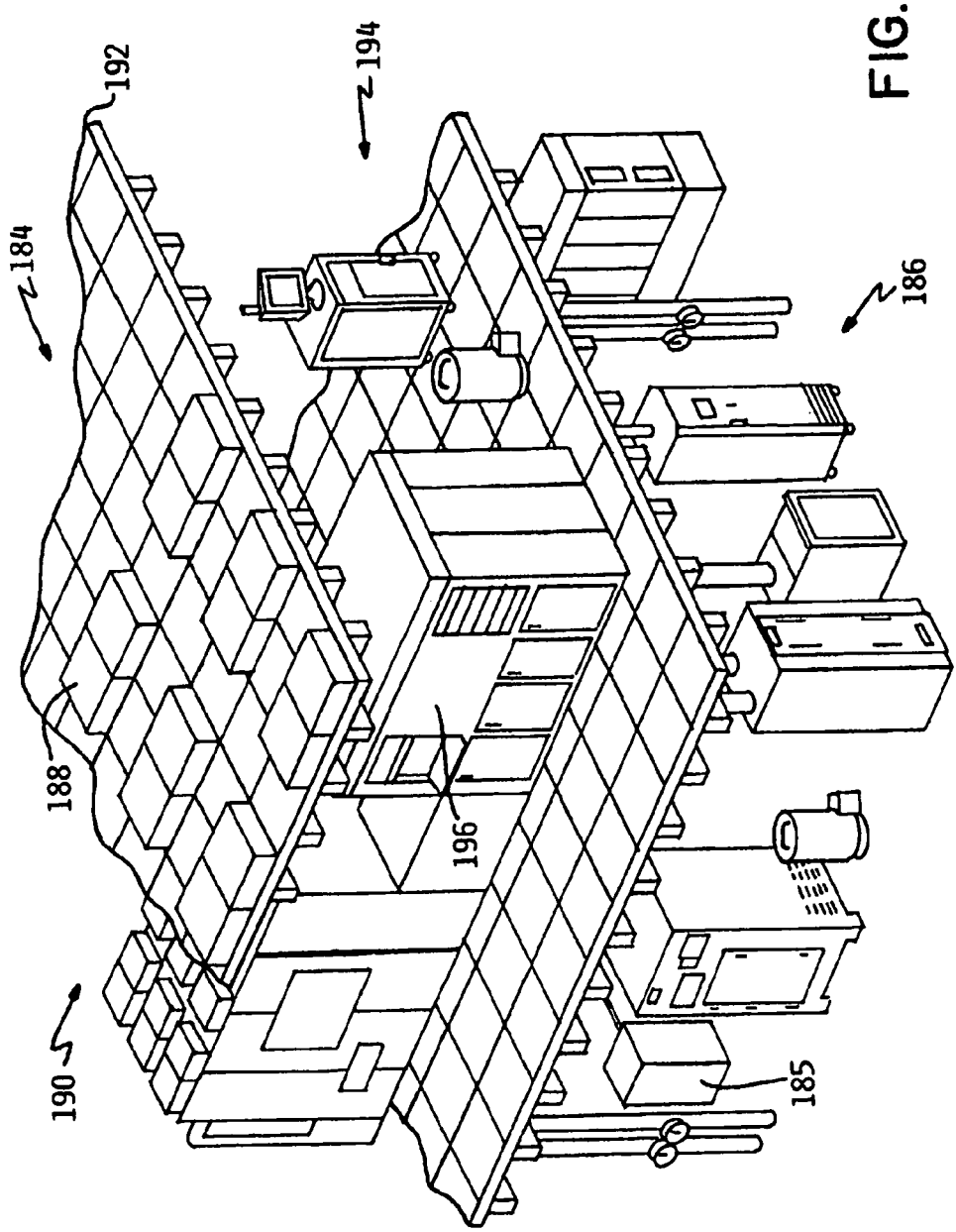
FIG. 12 is a representation of an exemplary system of the invention.

The invention also comprises systems and methods for purging reticle pods, cleanrooms, inspection areas, stockers and libraries. For example, FIG. 12 is a representation of an exemplary system of the invention. As shown, the system 184 is associated with a semiconductor manufacturing facility 186. The system 184 can comprise a purge system 185 associated with the facility. Preferably, the purge system includes a plurality of purge lines with one or more purge lines being associated with the facility. In one embodiment, purge lines can connect to the facility through one or more inlets thereto. Each inlet can also comprise diffuser elements as described herein. The system of the invention can provide periodic or continuous purge comprising CDA or, preferably, extra CDA.

Additionally, the system 184 can comprise an ionizer associated with the purge system 185. The ionizer can be associated with at least one of the plurality of purge lines of the purge system. The system of the invention can also include a purge gas source connected to the purge system that comprises a source of CDA, extra CDA or dry inert gases such as nitrogen. A preferred embodiment of the invention uses extra CDA. The system 184 can also comprise a plurality filter or filter members 188. Preferably, the filters 188 can be particulate filters. The filters can also comprise a variety of constructions. In one embodiment, each filter provides for a fluid-permeable, high efficiency, low-pressure drop, adsorptive composite filter such as generally described by U.S. Pat. Nos. 7,014,693, 6,761,753, 6,610,128, and 6,447,584, the contents of which are hereby incorporated by reference herein. For example, adsorptive media for the filter can include, without limitation, chemisorptive or physisorptive media and combinations thereof. Other media for the filter can comprise, for example, HEPA or ULPA filter mediums, which can also be used in combination or along with adsorptive media.

Preferably, the filters 188 of FIG. 12 can comprise, for example, HEPA or ULPA type filters. These filter types can remove particulates from a gas flow path passing therethrough. The system 184 can be disposed in a first or upper level 190 of the manufacturing facility 186. In one embodiment, chemisorptive filters can also be incorporated, mounted or coupled to a floor region 192 of the upper level 90, which is fluid permeable. The chemisorptive filters can be disposed above particulate filters. For example, each chemisorptive filter can be disposed adjacent to a particulate filter. The chemisorptive filters can communicate with a surface of the particulate filters disposed on the floor region 192. The chemisorptive and particulate filters can be in fluid communication via a gas stream, which preferably comprises the purge gas source, gases provided or circulated by a fan tower, circulation air handler, makeup handler or combinations thereof. The chemisorptive filters can remove contaminants present in a gas. Gas streams can pass through the chemisorptive filter and contact particulate filters. The particulate filters remove particulates from the gas stream as the stream passes through.

Preferably, the filters of FIG. 12 can permit a purge gas to circulate uniformly throughout an interior of the cleanroom. By uniformly circulating a purge gas such as CDA or extra CDA throughout the cleanroom, the amount of potential contaminants exposed to the reticle pods or reticles therein can be minimized. In one embodiment, a purge system can be associated with the cleanroom. Exemplary purge systems can comprise a plurality of purge lines as described herein. The purge lines can provide a purge gas source to reticle pods or reticles within the cleanroom as each is transported or used. The purge gas source can comprise a source of CDA or extra CDA for removing contaminants from the reticle pods or reticles. Purge gases can remove trace contaminants by entraining them in the gas flow.

In one embodiment, purging via the system 184 of the invention can dislodge and remove particulates and other contaminants such as those associated with filters. Purging with CDA or extra CDA also can maintain and control the humidity levels within the cleanroom 194. For example, the system of the invention can dehumidify the cleanroom. Moreover, a purge line for a system of the invention can be associated with the stockers, libraries and tools of a cleanroom, maintaining a concentration of less than about 10 ppb of water therein.

As shown, after the gas stream passes through the chemisorptive and particulate filters, the stream is introduced to the cleanroom 194. The filters can partially, substantially or completely filter the gas stream from particulates and contaminants. In one embodiment, the filters are in fluid communication with the cleanroom 194 via the gas stream. The invention contemplates partially, substantially or entirely purging the cleanroom via the purge gas source. The cleanroom can comprise tools 196, which are substantially disposed therein. The semiconductor manufacturing facility 186 can also comprise, without limitation, reticle pods, stockers, libraries or combinations thereof. Moreover, the facility also can comprise conventional devices and components for storage, inspection and transport of reticle pods and reticles therein. The invention also comprises systems and methods for purging reticle inspection areas. A reticle inspection area can also comprise one or more stockers as described herein.

The systems and methods of the invention can be used individually or in combination to control the mechanisms of contaminate and particulate formations at each stage of reticle use and storage. For example, as described, a conventional reticle inspection area can be purged via a purge gas source connected to the purge system that comprises a supply of CDA, extra CDA or dry inert gases such as nitrogen. In one embodiment, the purge of the inspection area can be an individual or discontinuous reticle purge. The invention also contemplates providing a reticle pod with continuous or discontinuous purges. For a discontinuous purge, a purifier or desiccant member as described herein can also be used. Similarly, a discontinuous purge can be used for a pod, stocker, library, tool, cleanroom or inspection area that is substantially or completely sealed.

Figure 13:
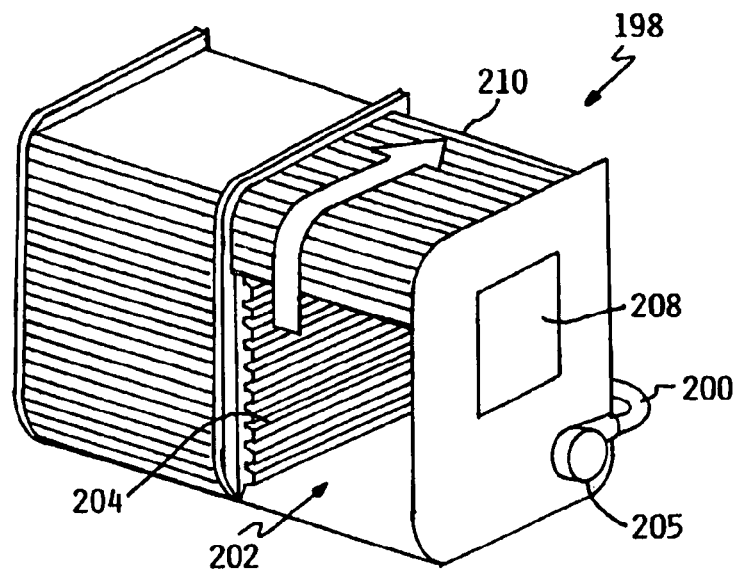
FIG. 13 is a representation of an exemplary reticle cassette of the invention.

During transportation of a reticle and standby within a tool or photo bay, passive AMC filtration can also be provided to avoid contamination. Similarly, continuous or discontinuous purging with CDA, extra CDA or dry inert gases may be preformed during transportation of a reticle and standby within a tool or photobay. For a library, CDA, extra CDA or dry inert gases can be provided thereto, which may increase purified air flows for the entire tool. Exemplary inert purge gas can include dry argon or nitrogen. In one embodiment, FIG. 13 is a representation of an exemplary reticle cassette of the invention. Preferably, the reticle cassette can permit a purge gas to circulate uniformly throughout an interior thereof. By uniformly circulating a purge gas such as CDA or extra CDA throughout the cassette, the amount of potential contaminants exposed to the reticles therein can be minimized. As shown, the reticle cassette 198 comprises a plurality of reticle slots 204, which can each be associated with a reticle.

In one embodiment, a purge system can be associated with the cassette. For example, the purge system includes a plurality of purge lines with each purge line being connected to the cassette. The invention contemplates use of a diffuser at the inlet of each reticle cassette, which causes a more even distribution of gas entering each cassette from the associated purge line. The diffuser can be mounted at the purge line inlet or injector port of the cassette or at the outlet of the purge line, where gas flows into the cassette. For example, the inlet 205 can be fitted with a diffuser element. Exemplary diffuser elements are described herein.

For the reticle cassette of FIG. 13, an ionizer can be associated with at least one of the purge lines of the purge system. In one embodiment, the cassette can store or hold a plurality of conventional reticles, each comprising a quartz material. The cassette generally comprises a door portion 210, which forms a hermetically sealed space to provide a controlled environment. Within the sealed environment, a reticle can be stored. The reticle can comprise quartz blanks, photomasks or substrates that are susceptible to damage from particulates and gas-phase chemical contaminants. Generally, purging the hermetically sealed space can removes trace contaminants by entraining them in the gas flow. Purging with CDA or extra CDA also can maintain and control the humidity levels within the cassette. Moreover, a purge line for the cassette can be associated therewith to purge contaminants and maintain a concentration of less than about 10 ppb of water therein.

As shown, the purge line 200 in FIG. 13 provides a purge gas source to reticles along at least one bank 202 of the cassette. The purge gas source can comprise a source of CDA or extra CDA for removing contaminants from a reticle. As shown, a purge line inlet 205 can be connected to at least one of the banks 202 of the reticle cassette 198. The banks are configured to receive a plurality of reticles with each disposed in a reticle slot 204. Preferably, the cassette can be configured to comprise at least one inlet 205 that connects or is associated with at least one purge line. A purge gas source can be connected or associated with a bank of the cassette through a purge line. Moreover, a purge gas source can communicate with a reticle disposed in contact with a slot. An exemplary cassette also comprises a filter member 208, preferably, a permeable getter filter member.

The filter member of FIG. 13 can have a variety of constructions each of which provides for a fluid-permeable, high efficiency, low-pressure drop, adsorptive composite filter such as generally described by U.S. Pat. Nos. 7,014,693, 6,761,753, 6,610,128, and 6,447,584, the contents of which are hereby incorporated by reference herein. For example, adsorptive media for the filter can include, for example, chemisorptive or physisorptive media and combinations thereof. Other media for the filter can comprise, without limitation, HEPA or ULPA filter mediums, which can also be used in combination or along with adsorptive media. Preferably, the cassette of the invention can comprise a passive purifier or desiccant member. Exemplary passive purifiers or desiccant members can reduce the extent of contaminants that may contact the reticle.

In one embodiment, the cassette can be compatible with standard cleaning agents used in semiconductor manufacturing facilities. Examples of materials for a reticle cassette include fiber reinforced molded polymers or PTFE coated metals such as aluminum or titanium. The invention also contemplates any suitable materials for a cassette. Preferably, a device for transitioning a reticle from atmospheric pressure to vacuum in a semiconductor tool can be provided. The invention also contemplates a reticle protection and transport system. For example, an indexer that stores a plurality of reticles in a storage bay can be provided. An inlet 205 of the cassette 198 can include an internal diffuser element. Exemplary diffusers include those comprising TEFLON (E. I. du Pont de Nemours and Company, 1007 Market Street, Wilmington, Del. 19898). The reticle cassette 198 can also comprise at least one door member 210. Preferably, the door member can minimize space requirements by comprising a roll top configuration.

Figure 14:
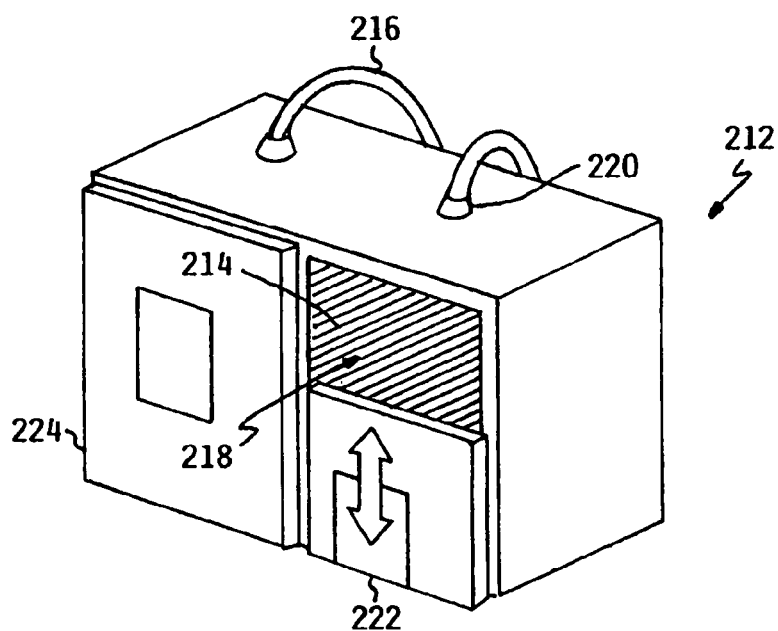
FIG. 14 is a representation of an exemplary reticle cassette of the invention.

FIG. 14 is a representation of an exemplary reticle cassette of the invention. Preferably, the reticle cassette can permit a purge gas to circulate uniformly throughout an interior thereof. By uniformly circulating a purge gas such as CDA or extra CDA throughout the cassette, the amount of potential contaminants exposed to the reticles therein can be minimized. As shown, the reticle cassette 212 comprises a plurality of reticle slots 214, which can each be associated with a reticle. In one embodiment, a purge system can be associated with the cassette. Exemplary purge systems can comprise at least one purge line as described herein. The purge lines 216 in FIG. 14 provide a purge gas source to reticles along both banks 218 of the cassette. The purge gas source can comprise a source of CDA or extra CDA for removing contaminants from a reticle.

As shown, one or more purge line inlets 220 can be connected to at least one of the banks 218 of the reticle cassette 212. The banks are configured to receive a plurality of reticles with each disposed in a reticle slot 214. Preferably, the cassette can be configured to comprise at least one inlet 220 that connects or is associated with at least one purge line. A purge gas source can be connected or associated with a bank of the cassette through a purge line. Moreover, a purge gas source can communicate with a reticle disposed in contact with a slot. An exemplary cassette also comprises a filter member 222, preferably, a permeable getter filter member.

In one embodiment, an inlet 220 of the cassette 212 can include an internal diffuser element. Exemplary diffuser elements include those comprising TEFLON (E. I. du Pont de Nemours and Company, 1007 Market Street, Wilmington, Del. 19898). The reticle cassette 212 can also comprise at least one door member 224. Preferably, the door member can minimize space requirements by comprising a retractable configuration.

For example, the purge system for the cassette of FIG. 14 can include a plurality of purge lines with each purge line being connected thereto. The invention contemplates use of a diffuser at the inlet of each reticle cassette, which causes a more even distribution of gas entering each cassette from the associated purge line. The diffuser can be mounted at the purge line inlet or injector port of the cassette or at the outlet of the purge line, where gas flows into the cassette. For example, the inlet can be fitted with a diffuser element. Exemplary diffuser elements are described herein.

For the reticle cassette of FIG. 14, an ionizer can be associated with at least one of the purge lines of the purge system. In one embodiment, the cassette can store or hold a plurality conventional reticles, each comprising a quartz material. The cassette generally comprises a door portion, which forms a hermetically sealed space to provide a controlled environment. Within the sealed environment, a reticle can be stored. The reticle can comprise quartz blanks, photomasks or substrates that are susceptible to damage from particulates and gas-phase chemical contaminants. Generally, purging the hermetically sealed space can removes trace contaminants by entraining them in the gas flow. Purging with CDA or extra CDA also can maintain and control the humidity levels within the cassette. Moreover, a purge line for the cassette can be associated therewith to purge contaminants and maintain a concentration of less than about 10 ppb of water therein.

The filter member of FIG. 14 can have a variety of constructions each of which provides for a fluid-permeable, high efficiency, low-pressure drop, adsorptive composite filter such as generally described by U.S. Pat. Nos. 7,014,693, 6,761,753, 6,610,128, and 6,447,584, the contents of which are hereby incorporated by reference herein. For example, adsorptive media for the filter can include, for example, chemisorptive or physisorptive media and combinations thereof. Other media for the filter can comprise, without limitation, HEPA or ULPA filter mediums, which can also be used in combination or along with adsorptive media. Preferably, the cassette of the invention can comprise a passive purifier or desiccant member. Exemplary passive purifiers or desiccant members can reduce the extent of contaminants that may contact the reticle.

In one embodiment, the cassette can be compatible with standard cleaning agents used in semiconductor manufacturing facilities. Examples of materials for a reticle cassette include fiber reinforced molded polymers or PTFE coated metals such as aluminum or titanium. The invention also contemplates any suitable materials for a cassette. Preferably, a device for transitioning a reticle from atmospheric pressure to vacuum in a semiconductor tool can be provided. The invention also contemplates a reticle protection and transport system. For example, an indexer that stores a plurality of reticles in a storage bay can be provided.

Figure 15:
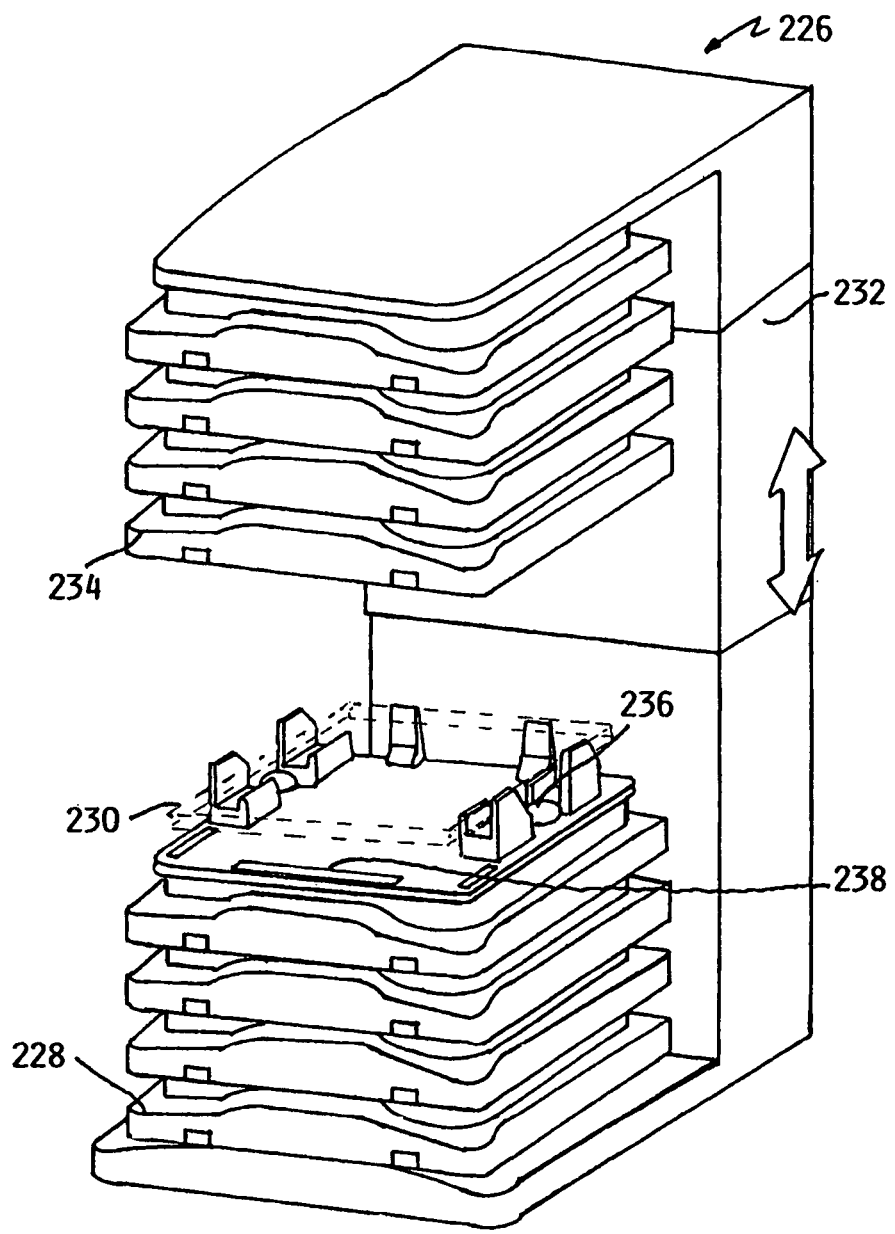
FIG. 15 is a representation of an exemplary expanding stack of the invention.

FIG. 15 is a representation of an exemplary expanding stack of the invention. Preferably, the expanding stack 226 can permit a purge gas to circulate uniformly throughout an interior of a reticle pod container or pod 228 associated therewith. In one embodiment, the reticle pod can be a SMIF as described herein. By uniformly circulating a purge gas such as CDA or extra CDA throughout the pod, the amount of potential contaminants exposed to the reticles therein can be minimized. As shown, the expanding stack can comprise a plurality of reticle pods, which can each be associated with a reticle 230. A purge system can also be associated with each pod. The purge gas source can comprise a source of CDA or extra CDA for removing contaminants from a reticle. A purge system can also be associated with one or more reticle pods. Exemplary purge systems can comprise at least one purge line as described herein. A purge line can provide a purge gas source to each reticle disposed in the pods. The purge gas source can comprise a source of CDA or extra CDA for removing contaminants from a reticle.

The expanding stack of FIG. 15 can include a lift member 232 for operably raising or lowering a reticle pod cover 234, to provide for access to a reticle therein. The reticle pod cover can be comparable to conventional SMIF pod domes. For example, the lift member can be selectively moved by a drive mechanism that is associated with the stack. The stack can also be substantially free of motors, moving parts, circuitry and other contaminant generating components. These features can also be external to the stack. As described, the reticle pod can include one or more diffuser elements 236. Preferably, a diffuser element can comprise TEFLON (E. I. du Pont de Nemours and Company, 1007 Market Street, Wilmington, Del. 19898). In one embodiment, each reticle pod can also comprise at least one filter member 238. The expanding stack allows for access to any reticle within the stack without compromising the microenvironment of the other reticles associated therewith.

For example, the purge system for the stack of FIG. 15 can include a plurality of purge lines with each purge line being connected thereto. The invention contemplates use of a diffuser at the inlet of each reticle container associated with the stack, which causes a more even distribution of entering gas from the associated purge line. The diffuser can be mounted at the purge line inlet or injector port of the containers or at the outlet of the purge line, where gas flows therein. For example, the inlet can be fitted with a diffuser element. Exemplary diffuser elements are described herein.

For the stack of FIG. 15, an ionizer can be associated with at least one of the purge lines of the purge system. In one embodiment, the stack can store or hold a plurality conventional reticles, each comprising a quartz material. The reticle containers or pods associated with the stack generally comprise a door portion, which forms a hermetically sealed space to provide a controlled environment. Within the sealed environment, a reticle can be stored. The reticle can comprise quartz blanks, photomasks or substrates that are susceptible to damage from particulates and gas-phase chemical contaminants. Generally, purging the hermetically sealed space can removes trace contaminants by entraining them in the gas flow. Purging with CDA or extra CDA also can maintain and control the humidity levels within the containers. Moreover, a purge line for the container can be associated therewith to purge contaminants and maintain a concentration of less than about 10 ppb of water therein.

The filter members of FIG. 15 can have a variety of constructions each of which provides for a fluid-permeable, high efficiency, low-pressure drop, adsorptive composite filter such as generally described by U.S. Pat. Nos. 7,014,693, 6,761,753, 6,610,128, and 6,447,584, the contents of which are hereby incorporated by reference herein. For example, adsorptive media for the filter can include, for example, chemisorptive or physisorptive media and combinations thereof. Other media for the filter can comprise, without limitation, HEPA or ULPA filter mediums, which can also be used in combination or along with adsorptive media.

Figure 16:
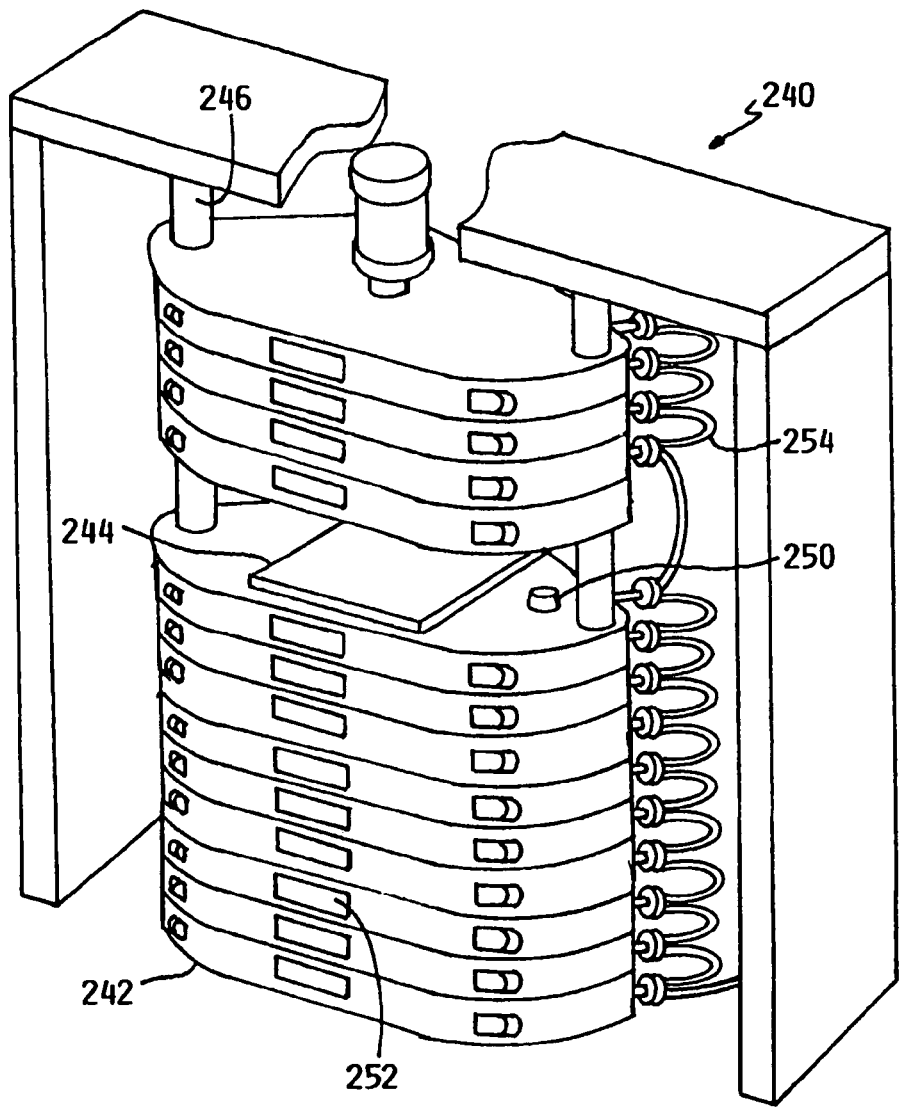
FIG. 16 is a representation of an exemplary expanding stack of the invention.

The invention also contemplates any suitable materials for a stack. Preferably, a device for transitioning a reticle from atmospheric pressure associated with container or pods of the stack to vacuum in a semiconductor tool can be provided. The invention also contemplates a reticle protection and transport system. FIG. 16 is a representation of an exemplary expanding stack of the invention. The stack of FIG. 16 can comprise each of the features, components and structures as describe for FIG. 15. Preferably, the expanding stack 240 can permit a purge gas to circulate uniformly throughout an interior of a reticle container or pod 242 associated therewith. In one embodiment, the reticle pod can be comparable to a SMIF type pod as described herein. By uniformly circulating a purge gas such as CDA or extra CDA throughout the pod, the amount of potential contaminants exposed to the reticles therein can be minimized. As shown, the expanding stack can comprise a plurality of reticle pods, which can each be associated with a reticle 244. A purge system can also be associated with each pod. Exemplary purge systems can comprise at least one purge line as described herein. The purge gas source can comprise a source of CDA or extra CDA for removing contaminants from a reticle.

The expanding stack of FIG. 16 can include a lift mechanism comprising guide members 246 for operably raising or lowering a reticle pod cover, to provide for access to a reticle therein. As described, the reticle pod can include one or more diffuser elements 250. Preferably, a diffuser element can comprise TEFLON (E. I. du Pont de Nemours and Company, 1007 Market Street, Wilmington, Del. 19898). In one embodiment, each reticle pod can also comprise at least one permeable getter filter member 252. The expanding stack allows for access to any reticle within the stack without compromising the microenvironment of the other reticles associated therewith. FIG. 16 also demonstrates the compactness of an expandable stack of the invention. Preferably, a purge system can be associated with one or more reticle pods. Exemplary purge systems can comprise at least one purge line shown as 254 and described herein. The purge lines 254 in FIG. 16 can provide a purge gas source to each reticle disposed in the pods. The purge gas source can comprise a source of CDA or extra CDA for removing contaminants from a reticle.

The invention contemplates use of a diffuser at the inlet of each reticle container associated with the stack of FIG. 16, which causes a more even distribution of entering gas from the associated purge line. The diffuser can be mounted at the purge line inlet or injector port of the containers or at the outlet of the purge line, where gas flows therein. For example, the inlet can be fitted with a diffuser element. Exemplary diffuser elements are described herein. For the stack of FIG. 16, an ionizer can also be associated with at least one of the purge lines of the purge system. Purging with CDA or extra CDA also can maintain and control the humidity levels within the containers.

Figure 17:
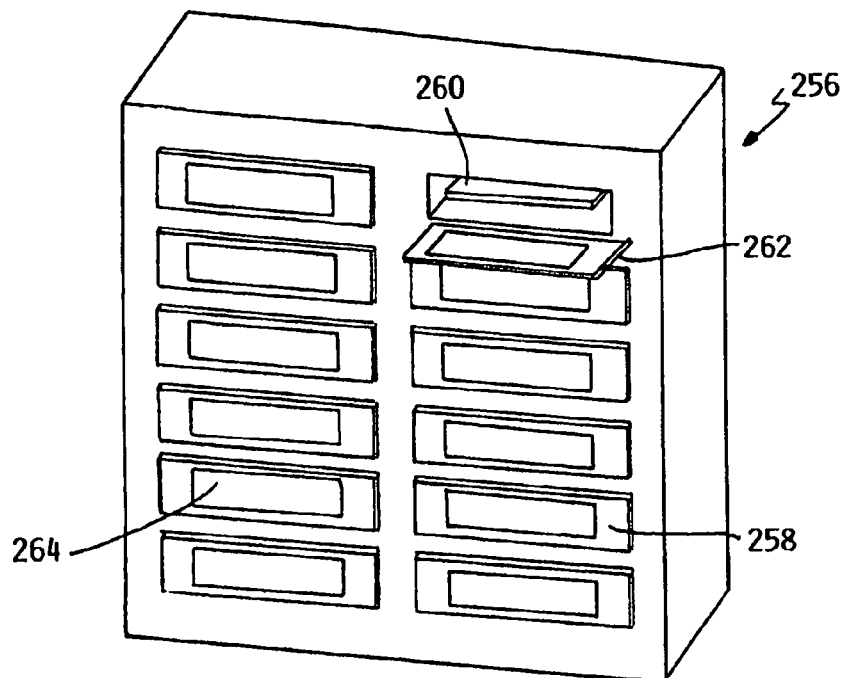
FIG. 17 is a representation of an exemplary library rack of the invention.

FIG. 17 is a representation of an exemplary library rack of the invention. Preferably, the library rack 256 can permit a purge gas to circulate uniformly throughout an interior of a reticle box 258 associated therewith. By uniformly circulating a purge gas such as CDA or extra CDA throughout each box, the amount of potential contaminants exposed to the reticles therein can be minimized. As shown, the library rack can comprise a plurality of reticle boxes, which can each be associated with a reticle 260. A purge system can also be associated with each box. In one embodiment, a box can be associated with a purge system via a purge line.

Preferably, the purge line can communicate with the box through a diffuser element. For example, a diffuser element can comprise TEFLON (E. I. du Pont de Nemours and Company, 1007 Market Street, Wilmington, Del. 19898). The purge gas source can comprise a source of CDA or extra CDA for removing contaminants from a reticle. A purge system can also be associated with one or more reticle boxes. Exemplary purge systems can comprise at least one purge line as described herein. A purge line can provide a purge gas source to each reticle disposed in the boxes. The purge gas source can comprise a source of CDA or extra CDA for removing contaminants from a reticle. The library rack of FIG. 17 can comprise reticle boxes that each include at least one door 262. A reticle box door allows access to a reticle therein and can close to provide for a clean microenvironment. An exemplary reticle box door can also comprise at least one permeable getter filter member 264.

For example, the purge system for the library of FIG. 17 can include a plurality of purge lines with each purge line being connected thereto. The invention contemplates use of a diffuser at the inlet of each reticle box, which causes a more even distribution of gas entering each box from the associated purge line. The diffuser can be mounted at the purge line inlet or injector port of the box or at the outlet of the purge line, where gas flows into the box. For example, the inlet can be fitted with a diffuser element. Exemplary diffuser elements are described herein.

For the library of FIG. 17, an ionizer can be associated with at least one of the purge lines of the purge system. In one embodiment, the library can store or hold a plurality conventional reticles in boxes therefore, each comprising a quartz material. The boxes generally comprise a door portion, which forms a hermetically sealed space to provide a controlled environment. Within the sealed environment, a reticle can be stored. The reticle can comprise quartz blanks, photomasks or substrates that are susceptible to damage from particulates and gas-phase chemical contaminants. Generally, purging the hermetically sealed space can removes trace contaminants by entraining them in the gas flow. Purging with CDA or extra CDA also can maintain and control the humidity levels within the individual boxes. Moreover, a purge line for the boxes can be associated therewith to purge contaminants and maintain a concentration of less than about 10 ppb of water therein.

The filter members of the boxes in FIG. 17 can have a variety of constructions each of which provides for a fluid-permeable, high efficiency, low-pressure drop, adsorptive composite filter such as generally described by U.S. Pat. Nos. 7,014,693, 6,761,753, 6,610,128, and 6,447,584, the contents of which are hereby incorporated by reference herein. For example, adsorptive media for the filter can include, for example, chemisorptive or physisorptive media and combinations thereof. Other media for the filter can comprise, without limitation, HEPA or ULPA filter mediums, which can also be used in combination or along with adsorptive media. Preferably, the boxes of the invention can comprise a passive purifier or desiccant member. Exemplary passive purifiers or desiccant members can reduce the extent of contaminants that may contact the reticle.

In one embodiment, the library and boxes can be compatible with standard cleaning agents used in semiconductor manufacturing facilities. Examples of materials for a reticle library or box include fiber reinforced molded polymers or PTFE coated metals such as aluminum or titanium. The invention also contemplates any suitable materials for a reticle library or box. Preferably, a device for transitioning a reticle from atmospheric pressure to vacuum in a semiconductor tool can be provided. The invention also contemplates a reticle protection and transport system. For example, an indexer that stores a plurality of reticles in a storage bay can be provided.

Figure 18:
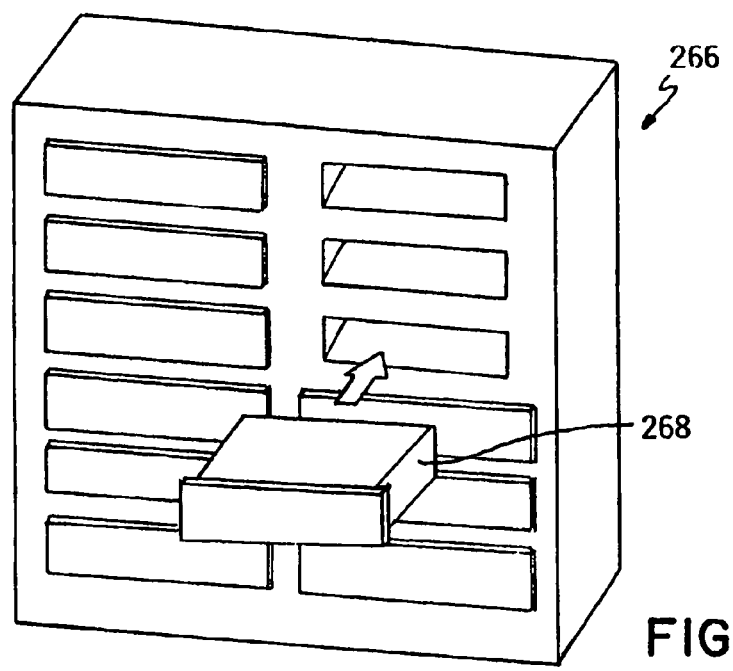
FIG. 18 is a representation of an exemplary library rack of the invention.

FIG. 18 is a representation of an exemplary library rack of the invention. The library of FIG. 18 can comprise each of the features, components and structures as describe for FIG. 17. Preferably, the library rack 266 can permit a purge gas to circulate uniformly throughout an interior of a reticle box 268 associated therewith. By uniformly circulating a purge gas such as CDA or extra CDA throughout each box, the amount of potential contaminants exposed to the reticles therein can be minimized. As shown, the library rack can comprise a plurality of reticle boxes, which can each be associated with a reticle. A purge system can also be associated with each box. In one embodiment, a box can be associated with a purge system via a purge line.

Preferably, the purge line can communicate with the box through a diffuser element. For example, a diffuser element can comprise TEFLON (E. I. du Pont de Nemours and Company, 1007 Market Street, Wilmington, Del. 19898). The purge gas source can comprise a source of CDA or extra CDA for removing contaminants from a reticle. A purge system can also be associated with one or more reticle boxes. Exemplary purge systems can comprise at least one purge line as described herein. A purge line can provide a purge gas source to each reticle disposed in the boxes. The purge gas source can comprise a source of CDA or extra CDA for removing contaminants from a reticle. The library rack of FIG. 18 comprises reticle boxes that can each include at least one door.

A reticle box door allows access to a reticle therein and can close to provide for a clean microenvironment. For example, the purge system for the library of FIG. 18 can include a plurality of purge lines with each purge line being connected thereto. The invention contemplates use of a diffuser at the inlet of each reticle box, which causes a more even distribution of gas entering each box from the associated purge line. The diffuser can be mounted at the purge line inlet or injector port of the box or at the outlet of the purge line, where gas flows into the box. For example, the inlet can be fitted with a diffuser element. Exemplary diffuser elements are described herein.

For the library of FIG. 18, an ionizer can be associated with at least one of the purge lines of the purge system. In one embodiment, the library can store or hold a plurality conventional reticles in boxes therefore, each comprising a quartz material. The boxes generally comprise a door portion, which forms a hermetically sealed space to provide a controlled environment. Within the sealed environment, a reticle can be stored. The reticle can comprise quartz blanks, photomasks or substrates that are susceptible to damage from particulates and gas-phase chemical contaminants. Generally, purging the hermetically sealed space can removes trace contaminants by entraining them in the gas flow. Purging with CDA or extra CDA also can maintain and control the humidity levels within the individual boxes. Moreover, a purge line for the boxes can be associated therewith to purge contaminants and maintain a concentration of less than about 10 ppb of water therein.

FIGS. 19, 20, 21 and 22 are representations of exemplary reticle boxes of the invention. As shown, each reticle box 270 can comprise at least one filter member 272, for example, a permeable getter filter member. The filter members of the boxes in FIGS. 19, 20, 21 and 22 can have a variety of constructions each of which provides for a fluid-permeable, high efficiency, low-pressure drop, adsorptive composite filter such as generally described by U.S. Pat. Nos. 7,014,693, 6,761,753, 6,610,128, and 6,447,584, the contents of which are hereby incorporated by reference herein. For example, adsorptive media for the filter can include, for example, chemisorptive or physisorptive media and combinations thereof. Other media for the filters can comprise, without limitation, HEPA or ULPA filter mediums, which can also be used in combination or along with adsorptive media. Preferably, the boxes of the invention can comprise a passive purifier or desiccant member. Exemplary passive purifiers or desiccant members can reduce the extent of contaminants that may contact the reticle.

Preferably, each box can permit a purge gas to circulate uniformly throughout an interior thereof. By uniformly circulating a purge gas such as CDA or extra CDA throughout each box, the amount of potential contaminants exposed to the reticles therein can be minimized. A purge system can also be associated with each box. In one embodiment, a box can be associated with a purge system via a purge line. The boxes of FIGS. 19, 20, 21 and 22 can include a plurality of purge lines with each purge line being connected thereto. The invention contemplates use of a diffuser at the inlet of each reticle box, which causes a more even distribution of gas entering each box from the associated purge line. The diffuser can be mounted at the purge line inlet or injector port of the box or at the outlet of the purge line, where gas flows into the box. For example, the inlet can be fitted with a diffuser element. Exemplary diffuser elements are described herein. In one embodiment, the library can store or hold a plurality conventional reticles in boxes therefor, each comprising a quartz material. The boxes generally comprise a door portion, which forms a hermetically sealed space to provide a controlled environment. Within the sealed environment, a reticle can be stored. The reticle can comprise quartz blanks, photomasks or substrates that are susceptible to damage from particulates and gas-phase chemical contaminants. Generally, purging the hermetically sealed space can removes trace contaminants by entraining them in the gas flow. Purging with CDA or extra CDA also can maintain and control the humidity levels within the individual boxes. Moreover, a purge line for the boxes can be associated therewith to purge contaminants and maintain a concentration of less than about 10 ppb of water therein.

Preferably, the purge line can communicate with the box through a diffuser element. For example, a diffuser element can comprise TEFLON (E. I. du Pont de Nemours and Company, 1007 Market Street, Wilmington, Del. 19898). The purge gas source can comprise a source of CDA or extra CDA for removing contaminants from a reticle. A purge system can also be associated with one or more reticle boxes. Exemplary purge systems can comprise at least one purge line as described herein. A purge line can provide a purge gas source to each reticle disposed in the boxes. The purge gas source can comprise a source of CD A or extra CDA for removing contaminants from a reticle. The reticle boxes of FIGS. 19, 20, 21 and 22 each include at least one door 274. A reticle box door allows access to a reticle therein and can close to provide for a clean microenvironment.

Figure 19:
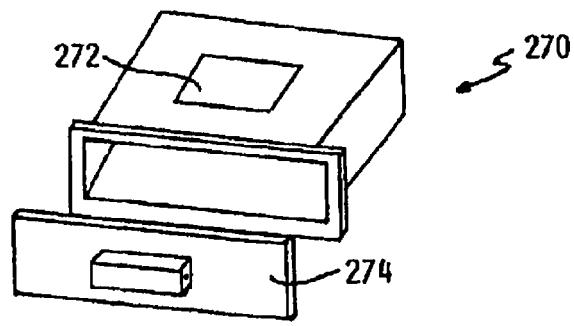
FIG. 19 is a representation of exemplary reticle boxes of the invention.
Figure 20:
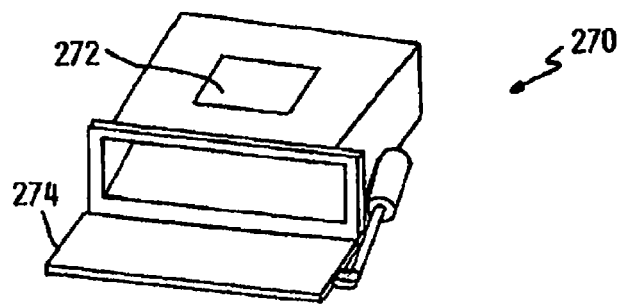
FIG. 20 is a representation of exemplary reticle boxes of the invention.

In one embodiment, FIG. 19 comprises a simple door. Preferably, the door can be removed by a robotic means such as, for example, those described herein. The robotic means can then remove the reticle from the box. As shown, the door separates completely from the box, providing access to a reticle therein. For example, the door can comprise a protrusion that can be grabbed by a robotic device to pull the door from the box. FIG. 20 comprises a hinged door. As shown, the door opens such that a reticle therein can be removed. The invention contemplates any suitable robotic means by which to open the door. The door of the box in FIG. 20 comprises an opening member by which a force can be applied to rotate the door away from the box on its hinge. The invention contemplates the force can be provided by an operator or robotic device. A person of ordinary skill in the art can appreciate the type of hinge or hinges that would be suitable for use with the box. Exemplary hinges are those that do not introduce or cause a significant amount of contaminant or particulate formations.

Figure 21:
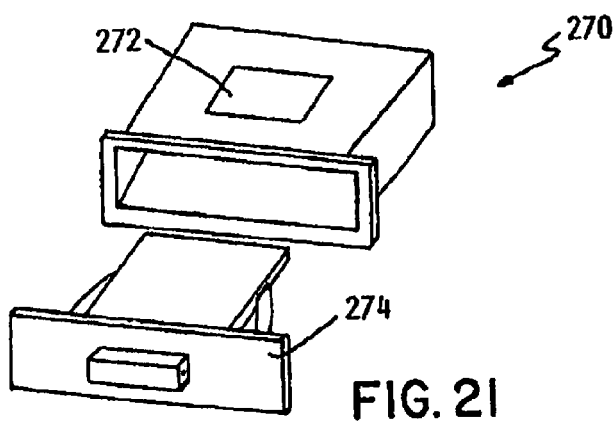
FIG. 21 is a representation of exemplary reticle boxes of the invention.

Moreover, FIG. 21 provides an end effector door, which can be associated with a reticle. Any suitable means can be used to remove the door, which can be transported in a semiconductor manufacturing facility with the reticle associated therewith. Preferably, the door can be removed by a robotic means such as, for example, those described herein. The robotic means can then remove the reticle from the box. As shown, the door separates completely from the box. For example, the door can comprise a protrusion that can be grabbed by a robotic device to pull the door from the box. The door is associated with the reticle such that removing the door allows transport in the reticle. An advantage of an end effector door is that one operation can be preformed to remove the door and transport the reticle, which can minimize the opportunity for increased contaminant or particulate formations when compared to multiple operations with myriad moving parts.

Figure 22:
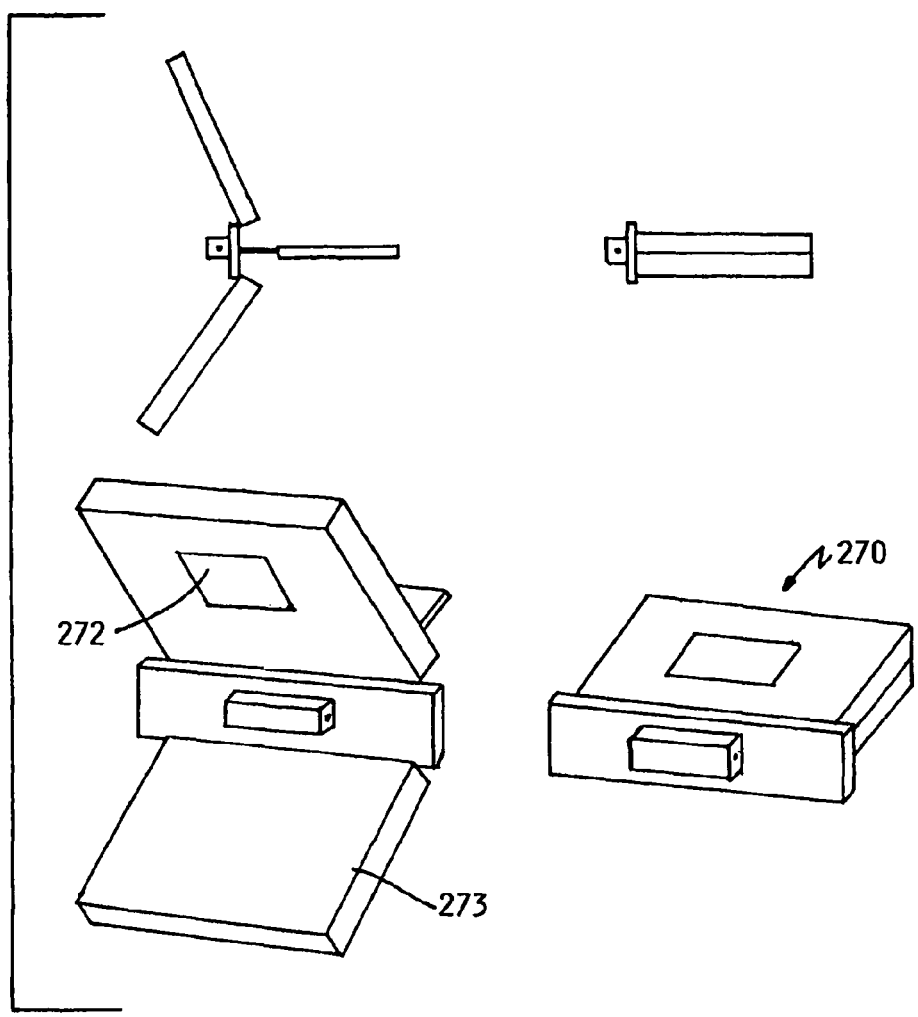
FIG. 22 is a representation of exemplary reticle boxes of the invention.

FIG. 22 provides a clam shell end effector door. The door of the box in FIG. 22 is associated with the reticle. The claim shell type cover 273 can protect the reticle as it moves through, for example, a tool. As described, a robotic means can be used to remove and transport the door and reticle. A person of ordinary skill in the art can incorporate hinges or related means with the box such that the cover is associated therewith. An upper and lower part of the cover can each rotate on the hinges in a manner moving them away from the reticle. The result is that the reticle can be covered during transport and exposed when required for use. Moreover, given that the cover is integrated with the box, only one operation need be preformed to remove the door and transport the reticle, which can minimize the opportunity for increased contaminant or particulate formations when compared to multiple operations with myriad moving parts. For example, the door of the box in FIG. 22 can comprise a protrusion that can be grabbed by a robotic device for transport.

Figure 23:
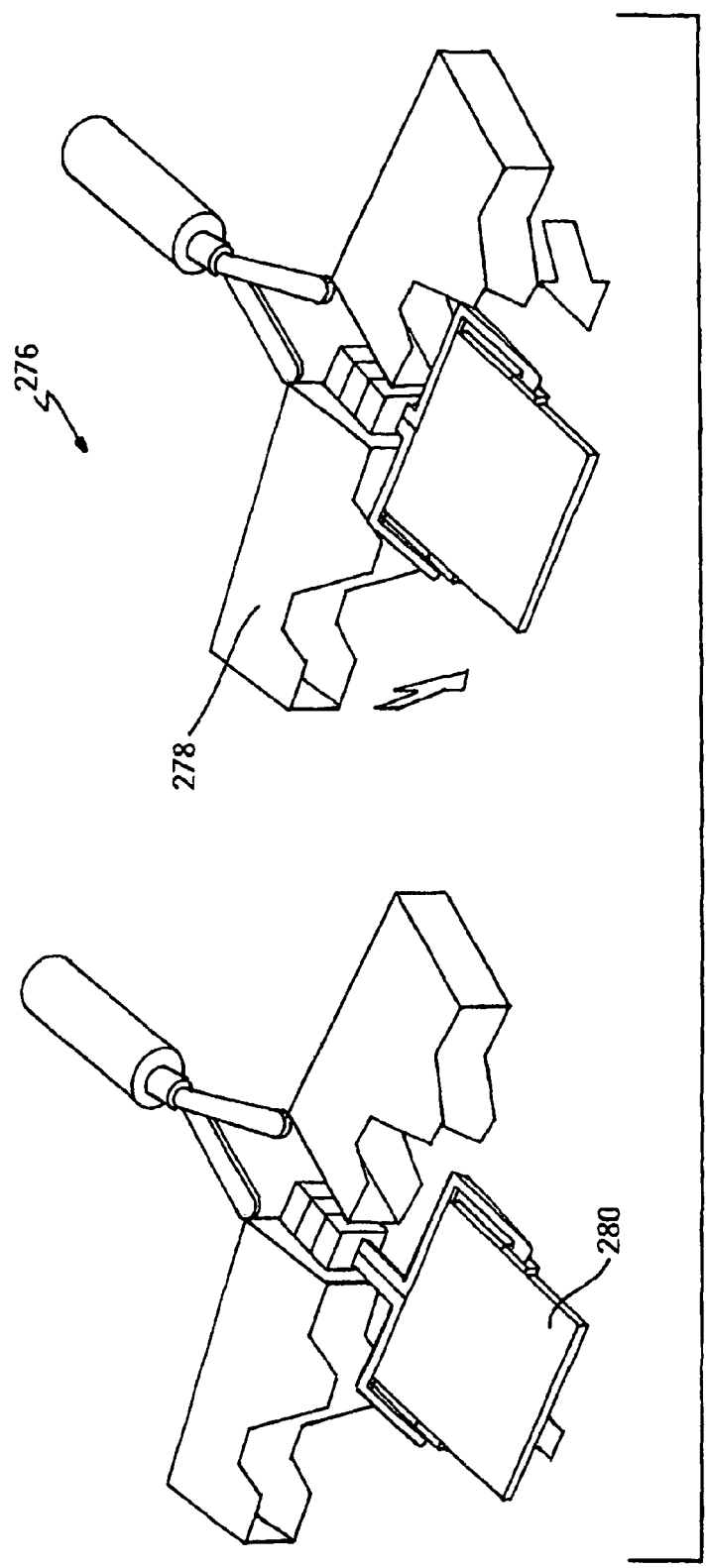
FIG. 23 is a representation of exemplary robot end effector reticle shield.

In one embodiment, an exemplary robotic means is shown in FIG. 23. For example, FIG. 23 is a representation of an exemplary robot end effector reticle shield. The robot end effector reticle shield 276 comprises a protective cover 278 than can be mounted thereon to protect the reticle 280 as it moves through a tool. The shield 276 of FIG. 23 can comprise standard robotic components that include, for example, a drive system and actuators. A controller for controlling the drive system of the robotic device can calculate a profile of a commanded motion before the motion is performed. The controller can also recalculate a profile multiple times until the controller determines the motion to be performed. The robotic device can also include a gripper arm for gripping the reticles, containers or pods during transport. The gripper arm can be drive able by a gripper arm drive for movement away from and towards a library or box. The robotic device can comprise a vertical column to which the gripper arm is movably mounted. Vertical movement of the gripper arm relative to the vertical column can be provided by a vertical drive. The robotic device can also include a carriage to which the vertical column is rotatably mounted.

The robotic device can also include a vision system for determining whether a container or pod is occupied or empty, positions of the gripper relative to the receptacle and whether the gripper is correctly gripping a reticle, container or pod. In one embodiment, a robotic end effector shield can provide for movement of reticle pods and reticles among areas of a semiconductor manufacturing facility. Preferably, standard robotic devices can also be used to transport reticle pods, reticles or combinations thereof to a reticle storage bay associated with a semiconductor tool. Such semiconductor tools can include lithography, etching, deposition or implantation tools. The shield can also comprise a handle member, which can be used to move the shield and associated reticle. In one embodiment, the handle member can also provide for a mechanism by which the cover can be opened to allow access to the reticle. A person of ordinary skill in the art can understand that the handle member may comprise any suitable design or configuration. Exemplary designs and configurations for the handle member allow it to be operably associated with the cover such that it is capable of moving the cover and providing access to at least one reticle therein.

The invention provides systems and methods for minimizing or treating reticle surface contaminant and particulate formations such as, for example, haze formations. Preferably, the systems and methods of the invention can be used to prevent or substantially remove and clean contaminant or particulate formations from the surface of a reticle. In general, transporting reticles within a semiconductor manufacturing facility tends to cause contaminants and particulates to be disposed or form on surfaces thereof. Typical contaminants and particulates on the surfaces of a reticle can include, for example, ammonium sulfate, ammonium carbonate, ammonium carbamate, acrylonitrile, butadiene styrene co-polymer, dimethyl phthalate, diethyl phthalate, dibutyl phthalate, dioctyl phthalate, palmitic acid, 2,4-di-t-butyl phenyl phosphite, 2,6-di-t-butyl phenyl phosphite, cellulose nitrate, methyl palmitate, potassium phosphate, cyanuric acid, stearic acid, t-butyl benzene, TINUVIN (Ciba Specialty Chemicals, 540 White Plains Road, Tarrytown, N.Y. 10591), oleic acid amide, brassidic acid amide, cyanoacrylate adhesive, poly(dimethyl siloxane), silicic acid, ammonium silicates, poly(methyl methacrylate), poly(butyl methacrylate), poly(methacrylic acid), poly(vinyl chloride), poly(vinylidene chloride, poly (tetrafluoroethylene, sodium ions, potassium ions, calcium ions, ceric ammonium salts, silica gels, organo silanes, organo, siloxanes, silanols, alkyl fluorosulfonic acids, aryl fluorosulfonic acids, Langmuir-Blodgett films of long chain polymer aliphatic compounds, sodium chloride, potassium chloride, glycine, protein residues, SANTOV AR (Great Lakes Chemical Corporation, 2226 Haynesville Highway El Dorado, Ark. 71731), nickel acetate, nickel sulfate, chromium sulfate, nylon, organo amines and nitrile compounds.

The formation of contaminants or particulates on the surface of a reticle can be through physical or chemical mechanisms and combinations thereof. Exemplary chemical mechanisms include those that are inorganic or organic. During lithography, contaminants and particulates can form on the surface of a reticle at various wavelengths including, for example, 365, 248 and 193 nm. Contaminants and particulates tend to form more rapidly on reticle surfaces at shorter wavelengths. The methods of the invention can be used to clean reticle surfaces on which contaminants and particulates are disposed or formed. Exemplary methods can substantially remove contaminants, particulates and combinations thereof from the surface of reticles for reuse. Prior to reuse, a reticle can also be pretreated by a performing a method of the invention. Pretreating a reticle can prevent or minimize contaminant or particulate formations that may occur in reuse. In one embodiment, a method of the invention comprises pretreating at least one surface of a reticle with a plasma. For example, oxygen plasma can bombard at least one reticle surface to prevent or minimize contaminant or particulate formations during subsequent use of the reticle. Other suitable plasmas can include those comprising, without limitation, nitrogen, argon, hydrogen, air and combinations thereof.

For example, a method of the invention can include a plasma formed by gaseous oxygen. A flow rate of gaseous oxygen can, without limitation, be from about 50 to 150 standard cubic centimeters per minute (sccm). Preferably, the plasma can bombard at least one surface of the reticle at a low temperature. Selection of a suitable plasma temperature for bombardment of a reticle surface can be performed by a person of ordinary school in the art. An exemplary plasma can be at pressures from about 10 to 100 millitorr (mT) and power of about 500 to 800 watts (W). The period of time for bombardment can vary as understood by a person of ordinary skill in the art. The invention also contemplates any means for providing bombardment of a reticle surface with an oxygen plasma. Such means for bombarding the surface of a reticle with an oxygen plasma can include conventional or emerging technologies. Conventional means for plasma bombardment of at least one reticle surface include devices or apparatuses generally described in U.S. Pat. Nos. 6,610,257 and 6,452,315, the contents of which are hereby incorporated by reference herein.

Plasma bombardment of a reticle surface can occur by operably associating a means therefor with, for example, a reticle pod, box, stocker, library or tool. In one embodiment, a means for plasma bombardment of a reticle, for example, a device or apparatus, can be incorporated into the design or physical structure of a reticle pod, box, stocker, library or tool. Incorporating a means for plasma bombardment into, without limitation, a reticle pod, box, stocker, library or tool can be performed by conventional approaches that account for process requirements and characteristics or properties of a semiconductor manufacturing facility. The type of conventional approach for incorporating a means of plasma bombardment in a reticle pod, box, stocker, library or tool can be selected and performed by a person of ordinary skill in the art.

In one embodiment, oxygen plasma bombardment can be used to prepare and clean or treat a reticle for reuse. A method of the invention can also comprise bombarding a reticle surface with an electrically conductive plasma including, without limitation, any type of ionized gas. Plasma bombardment of at least one reticle surface can also be used with each of the systems of the invention. For example, plasma bombardment can occur during reticle transport through a semiconductor manufacturing facility. The invention contemplates plasma bombarding at least one surface of a reticle on which silica gels are disposed or formed from use and transport thereof. Preferably, the plasma bombardment can convert silica gels disposed or fanned on a reticle surface to silicon dioxide. By converting silica gels disposed or formed on at least one surface of a reticle to silicon dioxide, the reticle can be reused.

The invention also provides a method for minimizing or controlling electromagnetic fields on or adjacent to at least one surface of a reticle. Preferably, the method comprises providing an electrostatic discharge means such as, for example, a Faraday cage or devices based thereon. Exemplary electrostatic discharge means are generally described by U.S. Pat. Nos. 6,084,178, 6,933,805 and 6,944,025 and U.S. Publication No. 2006/0151207, the contents of which are hereby incorporated by reference herein. The electrostatic discharge means can also comprise other conventional or emerging technologies.

A method of the invention can comprise using an electrostatic discharge means with each of the systems of the inventions. In one embodiment, electromagnetic fields on or adjacent to at least one reticle surface can be minimized or controlled by an electrostatic discharge means. For example, the method can be preformed during reticle transport through a semiconductor manufacturing facility. An electrostatic discharge means can also be operably associated with a reticle pod, box, stocker, library or tool. Preferably, an electrostatic discharge means, for example, a device or apparatus, can be incorporated into the design or physical structure of a reticle pod, box, stocker, library or tool. Incorporating an electrostatic discharge means into, without limitation, a reticle pod, box, stocker, library or tool can be performed by conventional approaches that account for process requirements and characteristics or properties of a semiconductor manufacturing facility. The type of conventional approach for incorporating an electrostatic discharge means in a reticle pod, box, stocker, library or tool can be selected and performed by a person of ordinary skill in the art.

Preferably, an electrostatic discharge means can comprise nanomaterials such as, without limitation, carbon nanotubes. Nanomaterials for use with electrostatic discharge means are generally described by U.S. Publication Nos. 2005/0208304 and 2005/0095938, the contents of which are hereby incorporated by reference herein. Single and multi-wall carbon nanotubes can be adapted by a person of ordinary skill in the art for use as electrostatic discharge means. Other conventional or emerging technologies related to nanomaterials can also be used to provide for an electrostatic discharge means.

As described, ammonium sulfate can be involved in haze formation on the surface of a reticle, which occurs in the presence of sulfuric acid, ammonia and water. Haze forms on reticle surfaces during transport through a semiconductor manufacturing facility. The invention provides systems and methods for minimizing or preventing haze formation by removing water from the reticle environment. Similarly, silica gels, organo silanes, organo siloxanes, silanols or combinations of these contaminants or particulates can form on the surfaces of a reticle. For example, without being bound to theory, these contaminants or particulates can comprise chemically and physically adsorbed water, which may each adhere to a reticle surface in the presence of water. The systems and methods of the invention can also reduce or minimize contaminants or particulates forming on the surfaces of a reticle by removing water from the reticle environment.

In particular, ammonia may be present from conventional rinse processes and reside on a quartz surface, for example, of a reticle. Negative ions can also be disposed on quartz materials or surfaces under pellicles. Similarly, sulfate can be available for formations from conventional cleaning processes and may reside on the chromium surface of chromium sulfate. Within a semiconductor manufacturing facility, ultraviolet light in the present of water may mobilize contaminants or particulates. Langmuir-Blodgett films of long chain polymer aliphatic compounds also tend to adhere to reticle surfaces in the presence of water. Through removal of water from reticle environments, the systems and methods of the invention can reduce or minimize the extent of these aliphatic compounds adhering to surfaces thereof.

While the present invention has been described herein in conjunction with a preferred embodiment, a person with ordinary skill in the art, after reading the foregoing, can effect changes, substitutions of equivalents and other types of alterations to those set forth herein. Each embodiment described above can also have included or incorporated therewith such variations as disclosed in regard to any or all of the other embodiments. Thus, it is intended that protection granted by Letters Patent hereon be limited in breadth and scope only by definitions contained in the appended claims and any equivalents thereof.

What is claimed is:

1. A reticle handling system comprising:
    a storage housing defining an enclosed interior environment with open space;
    a plurality of reticle pods for use therein;
    a gas delivery system that can be fluidly coupled to a purge gas source;
    the storage housing comprising a plurality of reticle storage receptacles in the enclosed interior environment, each reticle storage receptacle comprising a shelf or portion of a shelf for receiving one of the plurality of reticle pods, each said shelf or portion of the shelf having an upper side and a purge outlet oriented upwardly at said upper side, each said shelf or portion of the shelf having a lower side with open space of the enclosed interior environment therebelow, each said shelf or portion of the shelf having a void where each said shelf or portion of the shelf does not extend;
    wherein each reticle pod comprises an enclosure with structure for holding a reticle, each reticle pod having a door and shell, the shell having a bottom opening and the door sealingly engages the shell at the bottom opening, each reticle pod may be closed with the door latched to the shell and each reticle pod being openable by unlatching the door, the door having a purge inlet and a purge outlet ;
    each reticle storage receptacle having the purge outlet connected to the gas delivery system for connecting with the purge inlet of one of said reticle pods in place at said storage receptacle with said reticle pod being closed when on said storage receptacle;
    each shelf or portion of the shelf of each reticle storage receptacle having the void positioned such when a reticle pod is seated thereon, the purge outlet of the reticle pod is positioned over the void allowing discharge of the purge outlet of the reticle pod seated thereon through the void, past the shelf or portion of the shelf, and into the open space of the enclosed interior environment below the respective shelf or portion of the shelf of the storage housing while the reticle pod is closed and seated on the receptacle.

2. The reticle handling system of claim 1 wherein the open space of the enclosed interior environment has air therein and the gas delivery system delivers air which is at least clean dry air.

3. The reticle handling system of claim 2 wherein each of the reticle pods has a water absorbing filter therein that is recharged when exposed to air which is at least clean dry air.

4. The reticle handling system of claim 3 wherein each of the reticle pods has the water absorbing filter positioned in the purge outlet of the respective reticle pod such that any clean dry air that exits the purge outlet of the reticle pod exits through the water absorbing filter.

5. The reticle handling system of claim 1 wherein each of the plurality of reticle storage receptacles does not engage with the purge outlet of the door of the reticle pod seated thereon.

6. The reticle handling system of claim 1 wherein the shape of the purge outlets on each of the plurality of reticle pods is rectangular and a shape of each void corresponds to the shape of said purge outlets on each of the reticle pods.

7. The reticle handling system of claim 5 wherein the plurality of the reticle storage receptacles are swivelably attached to a post and are swivelable about a vertical axis.

8. The reticle handling system of claim 1 further comprising a robotic gripping device for individually gripping reticle pods for placement on and removal from the reticle storage receptacles, the robotic gripping device further comprising an air flow sensor for confirmation of the purge flow at the reticle storage receptacles.

9. The reticle handling system of claim 8 wherein the air flow sensor is positioned for detection of air flow in the interior environment emitting from the reticle storage receptacle purge outlet when a reticle pod is not positioned on the reticle storage receptacle.

10. A reticle handling system comprising:
a storage housing defining an enclosed interior environment;
a gas delivery system that can be fluidly coupled to a purge gas source;
the storage housing comprising a plurality of reticle storage receptacles in the enclosed interior environment, each reticle storage receptacle configured for receiving a reticle pod wherein each reticle pod having a purge inlet and a purge outlet; each reticle storage receptacle having a purge outlet connected to the gas delivery system for connecting with the purge inlet of a reticle in place at said storage receptacle;
a robotic gripping device for individually gripping reticle pods for placement on and removal from the reticle storage receptacles, the robotic gripping device further comprising an air flow sensor movable about the interior environment for confirmation of the purge flow in the interior environment at the reticle storage receptacles.

11. The reticle handling system of claim 10 wherein each reticle storage receptacle has a void below where a reticle pod would sit on the reticle storage receptacle for allowing discharge of the purge outlet into the enclosed interior environment of the storage housing.

12. A method of maintaining a low humidity environment on a plurality of reticles, the method comprising the steps of:
when not in use or when not in a process tool or an inspection tool, storing the reticles in a plurality of closed reticle pods that each have a purge inlet, a purge outlet, a moisture getter, a shell, and a door sealingly latchable onto the shell for closing the reticle pod, the moisture getter rechargeable when the reticle pods are purged with clean dry air;
storing each reticle pod in a reticle pod stocker, the reticle pod stocker having an open interior and a plurality of reticle pod receptacles, each for receiving a reticle pod; and
purging each closed reticle pod most of the time when each closed reticle pod is in the reticle pod stocker with at least clean dry air, said purging comprising generating at each reticle pod receptacle for the closed reticle pod placed thereon an individual first flow of clean dry air from a purge discharge dedicated to that reticle pod receptacle, positioned immediately above the closed reticle pod at that reticle pod receptacle, each discharge placed directly above and over the closed reticle pod and directed at and impinging an exterior of the closed reticle pod and thereby washing the exterior of the closed reticle pod with said clean dry air;
generating a second flow of clean dry air into an interior of each of said reticle pods, said second flow exiting each of the closed reticle pods through a bottom opening in each of said reticle pods; and
at an upper region of the reticle pod stocker providing a supplemental inlet for purge gas into the reticle pod stocker that is not directed to specific reticle pods in the stocker.

13. The method of claim 12 further comprising the step of maintaining each of the reticles when not in one of the reticle pods, in a sealed enclosure and washing each of the reticles with clean dry air most of the time when each of the reticles is in such a sealed enclosure and not in the reticle pod.

14. The method of claim 12 further comprising the step of purging each of the reticle pods substantially all of the time with at least CDA when each of the reticle pods is in the reticle pod stocker.

15. The method of claim 12 wherein the getter comprises a filter positioned in the purge outlet of each of the reticle pods.

16. The method of claim 12 wherein the reticle pod stocker has a plurality of reticle storage receptacles each with a purge outlet for connection to one of the reticle pods seated thereon, and wherein a robotic gripper grasps each of the reticle pods individually for seating on and removal from the storage receptacles, the gripping device having an air flow sensor for sensing air flow in the open interior and movable about the open interior and the method further comprises the step of sensing the flow of clean dry air at the reticle storage receptacle in the open interior.

17. A method of confirming flow in a reticle pod stocker that has a plurality of reticle storage receptacles with a respective purge outlets for connection to reticle pod seated thereon, comprising the step of positioning a reticle pod robotic gripper with an air flow sensor capable of measuring air flow in the proximity of one of the purge outlets for confirming air flow in the open interior.

18. A reticle pod stocker comprising:
an enclosed housing defining an enclosed interior environment;
a source of at least clean dry air connected to the reticle pod stocker;
a plurality of receptacles, each receptacle for receiving a closed reticle pod and having an open purge outlet extending upwardly for engaging the closed reticle pod at the receptacle, each purge outlet connected to the source of at least clean dry air whereby a purge stream exits upwardly at each open purge outlet for entering the closed reticle pod at the receptacle, each receptacle further having a purge line positioned above and discharging downwardly at each respective receptacle for individually impinging the exterior surface of the closed reticle pod at the receptacle and not entering the closed reticle pod at the receptacle;
the reticle pod stocker further having at an upper region of the reticle pod stocker a supplemental inlet for purge gas into the reticle pod stocker that is not directed to specific reticle pods in the stocker.
wherein when a reticle pod is seated on a receptacle the respective purge outlet injects the purge stream into the reticle pod and when the reticle pod is not seated thereon the purge outlet exits into the enclosed interior environment of the housing.

19. The reticle pod stocker of claim 18 further comprising a robotic gripper for placing and removing reticle pods at and from the receptacles, and wherein the robotic gripper comprises an air flow sensor movable throughout the open interior and capable of measuring air flow at different locations in the open interior for confirming air flow in the open interior at individual receptacles.

20. The reticle pod stocker of claim 18 wherein each receptacle has a pair of purge outlets each on opposite side of a void in the receptacle, and wherein the closed reticle pods have a purge outlet with an outlet filter positioned intermediate two purge inlets, and wherein the two purge inlets engage the two purge outlets for injecting a stream of at least clean dry air into the reticle pod, and wherein said stream of at least clean dry air exits the reticle pod at the void in the receptacle to the enclosed interior environment of the stocker and wherein the purge outlet of the closed reticle pods do not engage the receptacle.

21. A method of confirming flow in a reticle pod stocker that has an open interior and that has a plurality of reticle storage receptacles in said open interior, the method comprising the step of positioning an air flow sensor capable of measuring air flow and robotically movable throughout the open interior in the proximity of one of the receptacles for confirming air flow in the open interior.

\* \* \* \* \*

UNITED STATES PATENT AND TRADEMARK OFFICE
CERTIFICATE OF CORRECTION

PATENT NO. : 8,776,841 B2
APPLICATION NO. : 12/305895
DATED : July 15, 2014
INVENTOR(S) : Kishkovich et al.

It is certified that error appears in the above-identified patent and that said Letters Patent is hereby corrected as shown below:

On the Title page

In Column 1, item (51), under "Int. Cl.", delete "*H01L 21/67* (2006.01) *H01L 21/677* (2006.01)" and insert -- *H01L 21/67* (2006.01) --, therefor.

In Column 1, item (52), under "U.S. Cl.", delete "CPC ........ *H01L 21/67769* (2013.01); *Y10S 414/135* (2013.01); *Y10S 414/137* (2013.01); *Y10S 414/139* (2013.01); *Y10S 414/14* (2013.01)" and insert -- CPC ....... *H01L 21/67769* (2013.01) --, therefor.

In the Claims

In Column 30, Line 23, Claim 1, delete "outlet ;" and insert -- outlet; --, therefor.

In Column 32, Line 44, Claim 18, delete "stocker." and insert -- stocker --, therefor.

Signed and Sealed this
Sixteenth Day of June, 2015

Michelle K. Lee
*Director of the United States Patent and Trademark Office*